United States Patent
Nagae et al.

(10) Patent No.: US 9,580,634 B2
(45) Date of Patent: Feb. 28, 2017

(54) PHENOLIC-HYDROXYL-CONTAINING RESIN, EPOXY RESIN, CURABLE RESIN COMPOSITION, SUBSTANCE OBTAINED BY CURING SAME, AND SEMICONDUCTOR SEALANT

(71) Applicant: DIC Corporation, Tokyo (JP)

(72) Inventors: Norio Nagae, Ichihara (JP); Yousuke Hirota, Ichihara (JP); Yutaka Satou, Ichihara (JP); Nobuya Nakamura, Ichihara (JP)

(73) Assignee: DIC Corporation, Tokyo (JP)

( * ) Notice: Subject to any disclaimer, the term of this patent is extended or adjusted under 35 U.S.C. 154(b) by 116 days.

(21) Appl. No.: 14/439,869

(22) PCT Filed: Nov. 6, 2013

(86) PCT No.: PCT/JP2013/079991
§ 371 (c)(1),
(2) Date: Apr. 30, 2015

(87) PCT Pub. No.: WO2014/073557
PCT Pub. Date: May 15, 2014

(65) Prior Publication Data
US 2015/0291861 A1    Oct. 15, 2015

(30) Foreign Application Priority Data

Nov. 12, 2012 (JP) ................. 2012-248353
Apr. 22, 2013 (JP) ................. 2013-089278

(51) Int. Cl.
| | |
|---|---|
| C08G 8/28 | (2006.01) |
| H01L 23/29 | (2006.01) |
| C09J 163/04 | (2006.01) |
| C08G 59/06 | (2006.01) |
| C08G 8/12 | (2006.01) |
| C08G 59/02 | (2006.01) |
| C08K 3/36 | (2006.01) |
| C09J 161/06 | (2006.01) |

(52) U.S. Cl.
CPC .............. *C09J 163/04* (2013.01); *C08G 8/12* (2013.01); *C08G 8/28* (2013.01); *C08G 59/022* (2013.01); *C08G 59/063* (2013.01); *C08K 3/36* (2013.01); *C09J 161/06* (2013.01); *H01L 23/293* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,756,655 | A * | 5/1998 | Lucas, Jr. ............ | C08G 61/02 528/392 |
| 5,889,137 | A * | 3/1999 | Hutchings ............ | C08G 61/02 528/205 |
| 6,133,403 | A * | 10/2000 | Gerber ................. | C08L 61/06 524/128 |
| 2013/0184377 | A1 | 7/2013 | Ogura et al. | |

FOREIGN PATENT DOCUMENTS

| | | | |
|---|---|---|---|
| JP | 08120039 | A * | 5/1996 |
| JP | 3587570 | B2 | 11/2004 |
| WO | WO-2012/014715 | A1 | 2/2012 |

OTHER PUBLICATIONS

International Search Report dated Feb. 18, 2014, issued for PCT/JP2013/079991.

* cited by examiner

*Primary Examiner* — Vickey Nerangis
(74) *Attorney, Agent, or Firm* — Locke Lord LLP

(57) ABSTRACT

Provided are a phenolic-hydroxyl containing resin, an epoxy resin, and a curable resin composition containing either resin that have high flowability and exhibit high heat resistance and flame retardancy after curing, a cured composition formed therefrom, and a sealant. A phenolic-hydroxyl containing resin is prepared by reacting a polycondensate of a phenolic compound (a) and formaldehyde with an aralkylating agent. The phenolic-hydroxyl containing resin contains as essential components a monoaralkylated derivative (x1) of the phenolic compound (a) having one aralkyl group on an aromatic nucleus thereof and a diaralkylated derivative (x2) of the phenolic compound (a) having two aralkyl groups on an aromatic nucleus thereof. An epoxy resin is prepared by converting the phenolic-hydroxyl containing resin into a polyglycidyl ether.

18 Claims, 3 Drawing Sheets

PHENOLIC-HYDROXYL-CONTAINING RESIN, EPOXY RESIN, CURABLE RESIN COMPOSITION, SUBSTANCE OBTAINED BY CURING SAME, AND SEMICONDUCTOR SEALANT

TECHNICAL FIELD

The present invention relates to phenolic-hydroxyl containing resins, epoxy resins, and curable resin compositions containing either resin that have high flowability and exhibit high heat resistance and flame retardancy after curing, cured compositions formed therefrom, and semiconductor sealants.

BACKGROUND ART

Epoxy resins and phenolic-hydroxyl containing resins are used as materials such as adhesives, molding materials, and paints. These resins are also widely used in electrical and electronics engineering as materials such as semiconductor sealants and insulators for printed circuit boards because of their properties such as high heat resistance and moisture resistance after curing.

Among such various applications, technical advances are being made in the field of semiconductor sealants, including the shift to surface-mount packages such as BGAs and CSPs, the support for lead-free solders, and the elimination of halogenated flame retardants. Specifically, there is a need for a halogen-free resin material with a higher heat resistance, a lower thermal elastic modulus, and a higher flame retardancy. Along with these properties, resin materials, to which fillers such as silica are added for use as semiconductor sealants, require low viscosity and high flowability to achieve a higher filler content. With the increasing signal speed and frequency in various electronic devices, a correspondingly lower dielectric constant has also been required.

There are known resin materials designed to meet such various requirements, including a benzylated phenol novolac resin prepared by reacting a phenol novolac resin with p-methylbenzyl methyl ether at 140° C. for 5 hours and an epoxy resin prepared by reacting the benzylated phenol novolac resins with epichlorohydrin (see PTL 1).

CITATION LIST

Patent Literature

PTL 1: Japanese Patent No. 3587570

The phenol novolac resin and the epoxy resin disclosed in PTL 1 have low melt viscosity and high flowability compared to conventional resin materials. Unfortunately, these resins exhibit insufficient heat resistance after curing and thus fail to achieve a good balance of both properties at a high level.

SUMMARY OF INVENTION

Technical Problem

Accordingly, an object of the present invention is to provide a phenolic-hydroxyl containing resin, an epoxy resin, and a curable resin composition containing either resin that have high flowability and exhibit high heat resistance and flame retardancy after curing, a cured composition formed therefrom, and a sealant.

Solution to Problem

After conducting extensive research to achieve the foregoing object, the inventors have discovered that a phenolic-hydroxyl containing resin prepared by reacting a polycondensate of a phenolic compound and formaldehyde with an aralkylating agent and containing a particular amount of monoaralkylated derivative of the phenolic compound having one aralkyl group on an aromatic nucleus thereof and a particular amount of diaralkylated derivative of the phenolic compound having two aralkyl groups on an aromatic nucleus thereof and an epoxy resin prepared by converting the phenolic-hydroxyl containing resin into a polyglycidyl ether have high flowability and exhibit high heat resistance and flame retardancy after curing. This discovery has led to the present invention.

Specifically, the present invention relates to a phenolic-hydroxyl containing resin prepared by reacting a polycondensate of a phenolic compound (a) and formaldehyde with an aralkylating agent. The phenolic-hydroxyl containing resin contains as essential components a monoaralkylated derivative (x1) of the phenolic compound (a) having one aralkyl group on an aromatic nucleus thereof and a diaralkylated derivative (x2) of the phenolic compound (a) having two aralkyl groups on an aromatic nucleus thereof. The monoaralkylated derivative (x1) is present in an amount of 0.5% to 15.0% in terms of area percentage as determined by GPC. The diaralkylated derivative (x2) is present in an amount of 3.0% to 20.0% in terms of area percentage as determined by GPC.

The present invention further relates to a curable resin composition containing the phenolic-hydroxyl containing resin and a curing agent.

The present invention further relates to an epoxy resin prepared by converting into a polyglycidyl ether a phenolic resin prepared by reacting a polycondensate of a phenolic compound (b) and formaldehyde with an aralkylating agent. The epoxy resin contains as essential components a glycidyl ether (z1) of a monoaralkylated derivative of the phenolic compound (b) having one aralkyl group on an aromatic nucleus thereof and a glycidyl ether (z2) of a diaralkylated derivative of the phenolic compound (b) having two aralkyl groups on an aromatic nucleus thereof. The glycidyl ether (z1) of the monoaralkylated derivative is present in an amount of 0.5% to 15.0% in terms of area percentage as determined by GPC. The glycidyl ether (z2) of the diaralkylated derivative is present in an amount of 3.0% to 20.0% in terms of area percentage as determined by GPC.

The present invention further relates to a curable resin composition containing the epoxy resin and a curing agent.

The present invention further relates to a cured composition formed by curing either curable resin composition.

The present invention further relates to a semiconductor sealant containing either curable resin composition and an inorganic filler.

Advantageous Effects of Invention

The present invention provides a phenolic-hydroxyl containing resin, an epoxy resin, and a curable resin composition containing either resin that have high flowability and exhibit high heat resistance and flame retardancy after curing, a cured composition formed therefrom, and a sealant.

DESCRIPTION OF EMBODIMENTS

Figure 1:
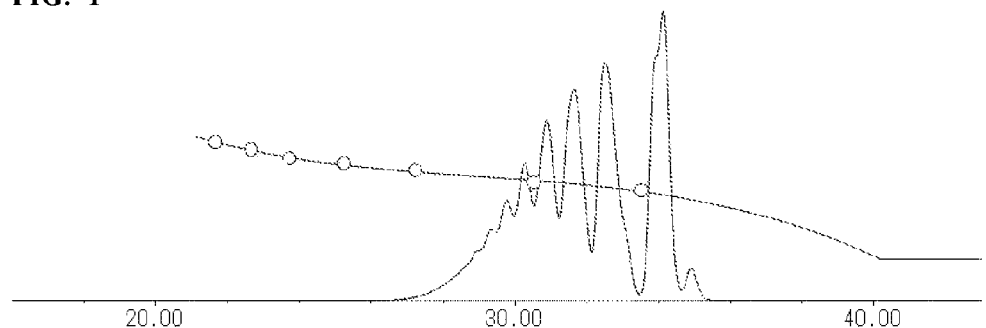
FIG. 1 is a GPC chart of a cresol novolac intermediate (1) prepared in Example 1.

The present invention will now be described in detail.

A phenolic-hydroxyl containing resin according to the present invention is a phenolic resin prepared by reacting a polycondensate of a phenolic compound (a) and formaldehyde with an aralkylating agent. The phenolic-hydroxyl containing resin according to the present invention contains as essential components a monoaralkylated derivative (x1) of the phenolic compound (a) having one aralkyl group on an aromatic nucleus thereof and a diaralkylated derivative (x2) of the phenolic compound (a) having two aralkyl groups on an aromatic nucleus thereof. The monoaralkylated derivative (x1) is present in an amount of 0.5% to 15.0% in terms of area percentage as determined by GPC. The diaralkylated derivative (x2) is present in an amount of 3.0% to 20.0% in terms of area percentage as determined by GPC.

That is, the phenolic-hydroxyl containing resin according to the present invention is a phenolic resin prepared by reacting a polycondensate of a phenolic compound (a) and formaldehyde with an aralkylating agent and is a mixture of various resin components. The phenolic-hydroxyl containing resin according to the present invention contains a monoaralkylated derivative (x1) of the phenolic compound (a) having one aralkyl group on an aromatic nucleus thereof (hereinafter referred to as "monoaralkylated derivative (x1)") and a diaralkylated derivative (x2) of the phenolic compound (a) having two aralkyl groups on an aromatic nucleus thereof (hereinafter referred to as "diaralkylated derivative (x2)"). The monoaralkylated derivative (x1) and the diaralkylated derivative (x2) are present in predetermined amounts.

The monoaralkylated derivative (x1), which is present as an essential component in the phenolic-hydroxyl containing resin according to the present invention, is a compound having a molecular structure with a relatively low molecular weight and a high aromatic ring concentration. This molecular structure is effective in improving the flowability of the overall phenolic-hydroxyl containing resin without lowering the heat resistance thereof after curing. This structure, having a high aromatic ring concentration, is also effective in improving the flame retardancy after curing. The monoaralkylated derivative (x1) is present in the phenolic-hydroxyl containing resin according to the present invention in an amount of 0.5% to 15% in terms of area percentage as determined by GPC. If the monoaralkylated derivative (x1) is present in an amount of less than 0.5%, the phenolic-hydroxyl containing resin has low flowability. If the monoaralkylated derivative (x1) is present in an amount of more than 15%, the phenolic-hydroxyl containing resin exhibits low heat resistance after curing.

As with the monoaralkylated derivative (x1), the diaralkylated derivative (x2), which is present as another essential component in the phenolic-hydroxyl containing resin according to the present invention, is effective in improving the flowability of the overall phenolic-hydroxyl containing resin without lowering the heat resistance thereof after curing. The diaralkylated derivative (x2), which has high molecular orientation compared to common novolac resins and also has a high aromatic ring concentration, is effective not only in improving the flowability without lowering the heat resistance after curing, but also in improving the flame retardancy and reducing the thermal elastic modulus after curing. The diaralkylated derivative (x2) is present in the phenolic-hydroxyl containing resin according to the present invention in an amount of 3% to 20% in terms of area percentage as determined by GPC. If the diaralkylated derivative (x2) is present in an amount of less than 3%, the phenolic-hydroxyl containing resin has low flowability. If the diaralkylated derivative (x2) is present in an amount of more than 20%, the phenolic-hydroxyl containing resin exhibits low heat resistance after curing.

The phenolic compound (a), which is a starting material for the phenolic-hydroxyl containing resin according to the present invention, may be any compound that has a phenolic hydroxyl group and at least two hydrogen atoms on the aromatic nucleus thereof and that can form the diaralkylated derivative (x2). Preferred phenolic compounds include phenol and phenolic compounds having one alkyl or alkoxy group of 1 to 4 carbon atoms on an aromatic nucleus derived from phenol, which have high reactivity and thus readily form the monoaralkylated derivative (x1) and the diaralkylated derivative (x2). More preferred phenolic compounds are phenolic compounds having one alkyl or alkoxy group of 1 to 4 carbon atoms on an aromatic nucleus derived from phenol, which provide a higher heat resistance after curing.

Specifically, the monoaralkylated derivative (x1) is a compound represented by structural formula (1):

[Chem. 1]

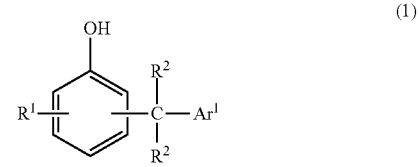

(1)

(where $R^1$ is an alkyl or alkoxy group of 1 to 4 carbon atoms; $R^2$ is each independently a hydrogen atom or an alkyl or alkoxy group of 1 to 4 carbon atoms; and $Ar^1$ is each independently phenyl, naphthyl, or a structural unit derived therefrom and having at least one halogen atom or alkyl or alkoxy group of 1 to 4 carbon atoms on an aromatic nucleus thereof). The diaralkylated derivative (x2) is a compound represented by structural formula (2):

[Chem. 2]

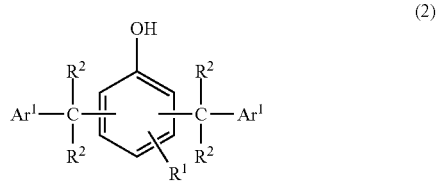

(2)

(where $R^1$ is an alkyl or alkoxy group of 1 to 4 carbon atoms; $R^2$ is each independently a hydrogen atom or an alkyl or alkoxy group of 1 to 4 carbon atoms; and $Ar^1$ is each independently phenyl, naphthyl, or a structural unit derived therefrom and having at least one halogen atom or alkyl or alkoxy group of 1 to 4 carbon atoms on an aromatic nucleus thereof).

Preferred phenolic compounds having one alkyl or alkoxy group of 1 to 4 carbon atoms on an aromatic nucleus derived from phenol include phenolic compounds having one alkyl or alkoxy group of 1 to 4 carbon atoms in an ortho or para position to the phenolic hydroxyl group, which have high reactivity and thus readily form the monoaralkylated derivative (x1) and the diaralkylated derivative (x2). Particularly preferred are o-cresol and p-cresol, which provide a higher heat resistance after curing.

As described above, the phenolic-hydroxyl containing resin according to the present invention is a phenolic resin prepared by reacting a polycondensate of the phenolic compound (a) and formaldehyde with an aralkylating agent and is a mixture of various resin components. In addition to the monoaralkylated derivative (x1) and the diaralkylated derivative (x2), the phenolic-hydroxyl containing resin according to the present invention preferably contains a phenolic resin in which the aromatic nuclei of the polycondensate of the phenolic compound (a) and formaldehyde are fully or partially aralkylated. One specific example is a polyfunctional compound (Y) having a structure represented by structural formula (3):

heat resistance and flame retardancy after curing. Such compounds of controlled structure also have high molecular orientation and high reactivity and thus reduce the thermal elastic modulus and dielectric constant after curing.

As described above, phenolic compounds having one alkyl or alkoxy group of 1 to 4 carbon atoms in an ortho or para position to the phenolic hydroxyl group are preferred as the phenolic compound (a) used in the present invention because they have high reactivity and thus readily form the monoaralkylated derivative (x1) and the diaralkylated derivative (x2). Phenolic compounds having one alkyl or alkoxy group of 1 to 4 carbon atoms in an ortho or para position to the phenolic hydroxyl group are also preferred because they readily form the polyfunctional compound (Y) represented by structural formula (3). Particularly preferred are o-cresol and p-cresol, which form a phenolic-hydroxyl containing resin having a higher heat resistance and flame retardancy after curing.

A preferred polyfunctional compound (Y) is a dimer of the phenolic compound (a) in which the two aromatic rings are aralkylated, e.g., a difunctional derivative (y1) represented by structural formula (3) where n is 0. The difunctional derivative (y1) is effective in improving the heat resistance and flame retardancy after curing because of its good balance of the aromatic ring concentration and the functional group concentration of the molecular structure and is also effective in reducing the thermal elastic modulus and the dielectric constant. The difunctional derivative (y1), which is a compound of relatively low molecular weight,

[Chem. 3]

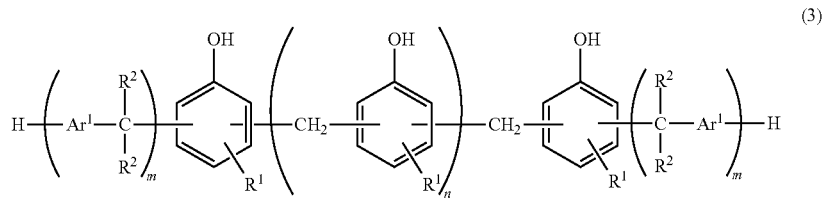

(3)

(where $R^1$ is an alkyl or alkoxy group of 1 to 4 carbon atoms; $R^2$ is each independently a hydrogen atom or an alkyl or alkoxy group of 1 to 4 carbon atoms; $Ar^1$ is each independently phenylene, naphthylene, or a structural unit derived therefrom and having at least one halogen atom or alkyl or alkoxy group of 1 to 4 carbon atoms on an aromatic nucleus thereof; m is each independently 1 or 2; and n is an integer of 0 to 20).

The polycondensation reaction of the phenolic compound (a) with formaldehyde and the reaction of the resulting polycondensate with an aralkylating agent occur mainly in the ortho and para positions to the phenolic hydroxyl group. Thus, if the phenolic compound (a) has one alkyl or alkoxy group of 1 to 4 carbon atoms in an ortho or para position to the phenolic hydroxyl group, a compound in which the two aromatic nuclei at the ends of the molecular chain of the polycondensate of the phenolic compound (a) and formaldehyde are aralkylated, i.e., the polyfunctional compound (Y) represented by structural formula (3), is produced in high yield.

The polyfunctional compound (Y), having a structure in which the two aromatic nuclei at the ends of the molecular chain are aralkylated, exhibits a limited increase in viscosity due to aralkylation and thus gives a phenolic-hydroxyl containing resin that has high flowability and exhibits high can improve the heat resistance after curing without increasing the viscosity of the resin. The difunctional derivative (y1) is preferably present in the phenolic-hydroxyl containing resin according to the present invention in an amount of 5% to 30% in terms of area percentage as determined by GPC. This results in high heat resistance and flame retardancy and low thermal elastic modulus and dielectric constant after curing.

The contents of the monoaralkylated derivative (x1), the diaralkylated derivative (x2), and the difunctional derivative (y1) in the phenolic-hydroxyl containing resin according to the present invention are expressed in terms of the percentages of their respective peak areas to the total peak area of the phenolic-hydroxyl containing resin according to the present invention as calculated from GPC measurements taken under the following conditions: GPC Measurement Conditions Measurement system: "HLC-8220 GPC" from Tosoh Corporation Columns: "HXL-L" guard column from Tosoh Corporation
+"TSK-GEL G2000HXL" from Tosoh Corporation
+"TSK-GEL G2000HXL" from Tosoh Corporation
+"TSK-GEL G3000HXL" from Tosoh Corporation
+"TSK-GEL G4000HXL" from Tosoh Corporation Detector: differential refractive index (RI) detector Data processing: "GPC-8020 Model II ver. 4.10" from Tosoh Corporation Measurement conditions:

Column temperature: 40° C.

Developing solvent: tetrahydrofuran

Flow rate: 1.0 mL/min

Standards: the following monodisperse polystyrene standards of known molecular weights were used in accordance with the measurement manual for "GPC-8020 Model II ver. 4.10".

Polystyrene Standards Used:

"A-500" from Tosoh Corporation

"A-1000" from Tosoh Corporation

"A-2500" from Tosoh Corporation

"A-5000" from Tosoh Corporation

"F-1" from Tosoh Corporation

"F-2" from Tosoh Corporation

"F-4" from Tosoh Corporation

"F-10" from Tosoh Corporation

"F-20" from Tosoh Corporation

"F-40" from Tosoh Corporation

"F-80" from Tosoh Corporation

"F-128" from Tosoh Corporation

Sample: 1.0% by mass (on a resin solids basis) microfiltered solution in tetrahydrofuran (50 μL).

The phenolic-hydroxyl containing resin according to the present invention described above can be manufactured, for example, by the following method. Specifically, the phenolic-hydroxyl containing resin according to the present invention can be manufactured by reacting the phenolic compound (a) with formaldehyde in the presence of a polymerization catalyst to form a polycondensate (step 1) and then reacting the resulting polycondensate with an aralkylating agent in an organic solvent in the presence of an acid catalyst (step 2).

Step 1 will be described first. The formaldehyde used for the reaction with the phenolic compound (a) in this step may be in the form of an aqueous solution, i.e., formalin, or may be in the form of a solid, i.e., paraformaldehyde. The formaldehyde is typically reacted with the phenolic compound (a) in an amount of 0.01 to 0.9 mol per mole of the phenolic compound (a). Preferably, the formaldehyde is reacted with the phenolic compound (a) in an amount of 0.01 to 0.8 mol, more preferably 0.01 to 0.7 mol, per mole of the phenolic compound (a), which facilitates the formation of a dimer of the phenolic compound (a).

Examples of polymerization catalysts for use in the reaction in step 1 include, but not limited to, acid catalysts, including inorganic acids such as hydrochloric acid, sulfuric acid, and phosphoric acid; organic acids such as methanesulfonic acid, p-toluenesulfonic acid, and oxalic acid; and Lewis acids such as boron trifluoride, anhydrous aluminum chloride, and zinc chloride. The polymerization catalyst is preferably used in an amount of 0.1% to 5% by mass of the total mass of the reactants.

Step 1 is typically performed at 100° C. to 200° C. for 1 to 20 hours. Step 1 may be performed in an organic solvent if necessary. The organic solvent used herein may be any organic solvent that can be used under the above temperature conditions. Specific examples of such organic solvents include methyl cellosolve, ethyl cellosolve, toluene, xylene, and methyl isobutyl ketone. These organic solvents, when used, are preferably present in an amount of 10% to 500% by mass of the total mass of the reactants.

To reduce coloration of the resulting polycondensate, various antioxidants and reductants may be used in step 1. Examples of antioxidants include hindered phenols such as 2,6-dialkylphenols, divalent sulfur compounds, and phosphites containing trivalent phosphorus atoms. Examples of reductants include hypophosphorous acid, phosphorous acid, thiosulfuric acid, sulfurous acid, hydrosulfite, salts thereof, and zinc.

After the reaction in step 1 is complete, the reaction mixture is neutralized or washed with water to a pH of 3 to 7, preferably 4 to 7. The reaction mixture may be neutralized or washed with water as usual. Specifically, if an acid catalyst is used as the polymerization catalyst, a basic substance such as sodium hydroxide, potassium hydroxide, sodium carbonate, ammonia, triethylenetetramine, or aniline may be used as a neutralizer. Buffers such as phosphoric acid may be added before neutralization. The mixture may be basified before being adjusted to a pH of 3 to 7, for example, with oxalic acid.

After neutralization or washing with water, the reaction mixture is distilled by heating under reduced pressure to remove impurities such as unreacted reactants, organic solvent, and by-products. The reaction product can thus be concentrated to obtain the target polycondensate.

The polycondensate obtained in step 1 preferably has a softening point of 80° C. or lower as measured in accordance with JIS K7234. This facilitates the adjustment of the contents of the monoaralkylated derivative (x1), the diaralkylated derivative (x2), and the difunctional derivative (y1) in the phenolic-hydroxyl containing resin finally obtained to their respective preferred ranges described above.

In the next step, i.e., step 2, the resulting polycondensate is reacted with an aralkylating agent. Examples of aralkylating agents for use in this step include phenylmethanols, phenylmethyl halides, naphthylmethanols, naphthylmethyl halides, and styrenes. Specific examples include benzyl chloride, benzyl bromide, benzyl iodide, o-methylbenzyl chloride, m-methylbenzyl chloride, p-methylbenzyl chloride, p-ethylbenzyl chloride, p-isopropylbenzyl chloride, p-tert-butylbenzyl chloride, p-phenylbenzyl chloride, 5-chloromethylacenaphthylene, 2-naphthylmethyl chloride, 1-chloromethyl-2-naphthalene, and nucleus-substituted isomers thereof; α-methylbenzyl chloride, α,α-dimethylbenzyl chloride, benzyl methyl ether, o-methylbenzyl methyl ether, m-methylbenzyl methyl ether, p-methylbenzyl methyl ether, p-ethylbenzyl methyl ether, and nucleus-substituted isomers thereof; benzyl ethyl ether, benzyl propyl ether, benzyl isobutyl ether, benzyl n-butyl ether, p-methylbenzyl methyl ether, and nucleus-substituted isomers thereof; benzyl alcohol, o-methylbenzyl alcohol, m-methylbenzyl alcohol, p-methylbenzyl alcohol, p-ethylbenzyl alcohol, p-isopropylbenzyl alcohol, p-tert-butylbenzyl alcohol, p-phenylbenzyl alcohol, α-naphthylmethanol, and nucleus-substituted isomers thereof; and α-methylbenzyl alcohol, α,α-dimethylbenzyl alcohol, styrene, o-methylstyrene, m-methylstyrene, p-methylstyrene, α-methylstyrene, and β-methylstyrene. These aralkylating agents may be used alone or in combination.

Preferred aralkylating agents include benzyl alcohols and naphthylmethanols such as benzyl alcohol, o-methylbenzyl alcohol, m-methylbenzyl alcohol, p-methylbenzyl alcohol, p-ethylbenzyl alcohol, p-isopropylbenzyl alcohol, p-tert-butylbenzyl alcohol, p-phenylbenzyl alcohol, and α-naphthylmethanol, which have high reactivity and thus readily form the monoaralkylated derivative (x1) and the diaralkylated derivative (x2). Particularly preferred are benzyl alcohols.

In step 2, the aralkylating agent is preferably reacted with the polycondensate obtained in step 1 in an amount of 0.55 to 0.80 mol per mole of the phenolic compound (a) used in step 1, depending on, for example, the amount of unreacted phenolic compound (a) in the polycondensate and the average number of nuclei in the polycondensate. If the phenolic compounds serving as the precursors of the monoaralkylated derivative (x1), the diaralkylated derivative (x2), and the difunctional derivative (y1) are present in amounts within their respective preferred ranges, the resulting phenolic-hydroxyl containing resin has high flowability and exhibits low thermal elastic modulus and high heat resistance and flame retardancy after curing.

Examples of acid catalysts for use in step 2 include inorganic acids such as hydrochloric acid, sulfuric acid, and phosphoric acid; organic acids such as methanesulfonic acid, p-toluenesulfonic acid, and oxalic acid; and Lewis acids such as boron trifluoride, anhydrous aluminum chloride, and zinc chloride. Particularly preferred are organic acids, which have high catalytic activity and thus promote the formation of the monoaralkylated derivative (x1) and the diaralkylated derivative (x2). The polymerization catalyst is preferably used in an amount of 0.1% to 5% by mass of the total mass of the reactants.

To promote the formation of the monoaralkylated derivative (x1) and the diaralkylated derivative (x2), the reaction in step 2 is preferably performed at elevated temperatures, i.e., 100° C. to 200° C., more preferably 130° C. or higher. Although the time for the reaction in step 2 varies depending on the scale of manufacture, the monoaralkylated derivative (x1) and the diaralkylated derivative (x2) form in larger amounts as the reaction mixture is maintained at 100° C. or higher, preferably 130° C. or higher, for a longer period of time. Specifically, the reaction mixture is preferably maintained at 100° C. or higher, preferably 130° C. or higher, for 4 hours or more.

The reaction in step 2 may be performed in an organic solvent to promote the formation of the monoaralkylated derivative (x1) and the diaralkylated derivative (x2). The organic solvent used herein may be any organic solvent that can be used under the above temperature conditions. Specific examples of such organic solvents include methyl cellosolve, ethyl cellosolve, toluene, xylene, and methyl isobutyl ketone. These organic solvents are preferably used in an amount of 10% to 500% by mass of the total mass of the reactants, which effectively promotes the reaction.

After step 2 is complete, the reaction product may be, for example, neutralized or washed with water to obtain the target phenolic-hydroxyl containing resin.

The thus-obtained phenolic-hydroxyl containing resin preferably has a hydroxyl equivalent weight of 150 to 250 g/eq, which results in high flowability and curability.

One of the features of the phenolic-hydroxyl containing resin according to the present invention is its high flowability. Specifically, the phenolic-hydroxyl containing resin according to the present invention preferably has a softening point of 40° C. to 90° C. and a melt viscosity at 150° C. of 0.01 to 10 dPa·s.

An epoxy resin according to the present invention is an epoxy resin prepared by converting into a polyglycidyl ether a phenolic resin prepared by reacting a polycondensate of a phenolic compound (b) and formaldehyde with an aralkylating agent. The epoxy resin according to the present invention contains as essential components a glycidyl ether (z1) of a monoaralkylated derivative of the phenolic compound (b) having one aralkyl group on an aromatic nucleus thereof and a glycidyl ether (z2) of a diaralkylated derivative of the phenolic compound (b) having two aralkyl groups on an aromatic nucleus thereof. The glycidyl ether (z1) of the monoaralkylated derivative is present in an amount of 0.5% to 15.0% in terms of area percentage as determined by GPC. The glycidyl ether (z2) of the diaralkylated derivative is present in an amount of 3.0% to 20.0% in terms of area percentage as determined by GPC.

That is, the epoxy resin according to the present invention is an epoxy resin prepared by converting into a polyglycidyl ether a phenolic resin prepared by reacting a polycondensate of a phenolic compound (b) and formaldehyde with an aralkylating agent and is a mixture of various resin components. The epoxy resin according to the present invention contains a glycidyl ether (z1) of a monoaralkylated derivative of the phenolic compound (b) having one aralkyl group on an aromatic nucleus thereof (hereinafter referred to as "monoaralkylated derivative (z1)") and a glycidyl ether (z2) of a diaralkylated derivative of the phenolic compound (b) having two aralkyl groups on an aromatic nucleus thereof (hereinafter referred to as "diaralkylated derivative (z2)"). The monoaralkylated derivative (z1) and the diaralkylated derivative (z2) are present in predetermined amounts.

The monoaralkylated derivative (z1), which is present as an essential component in the epoxy resin according to the present invention, is a compound having a molecular structure with a relatively low molecular weight and a high aromatic ring concentration. This molecular structure is effective in improving the flowability of the epoxy resin without lowering the heat resistance thereof after curing. This structure, having a high aromatic ring concentration, is also effective in improving the flame retardancy after curing. The monoaralkylated derivative (z1) is present in the epoxy resin according to the present invention in an amount of 0.5% to 15% in terms of area percentage as determined by GPC. If the monoaralkylated derivative (z1) is present in an amount of less than 0.5%, the epoxy resin has low flowability. If the monoaralkylated derivative (z1) is present in an amount of more than 15%, the epoxy resin exhibits low heat resistance after curing.

As with the monoaralkylated derivative (z1), the diaralkylated derivative (z2), which is present as another essential component in the epoxy resin according to the present invention, is effective in improving the flowability of the epoxy resin without lowering the heat resistance thereof after curing. The diaralkylated derivative (z2), which has high molecular orientation compared to common novolac resins and also has a high aromatic ring concentration, is effective not only in curing, but also in improving the flame retardancy and reducing the thermal elastic modulus after curing. The diaralkylated derivative (z2) is present in the epoxy resin according to the present invention in an amount of 3% to 20% in terms of area percentage as determined by GPC. If the diaralkylated derivative (z2) is present in an amount of less than 3%, the epoxy resin has low flowability. If the diaralkylated derivative (z2) is present in an amount of more than 20%, the epoxy resin exhibits low heat resistance after curing.

The phenolic compound (b), which is a starting material for the epoxy resin according to the present invention, may be any compound that has a phenolic hydroxyl group and at least two hydrogen atoms on the aromatic nucleus thereof and that can form the diaralkylated derivative (z2). Preferred phenolic compounds include phenol and phenolic compounds having one alkyl or alkoxy group of 1 to 4 carbon atoms on an aromatic nucleus derived from phenol, which have high reactivity and thus readily form the monoaralkylated derivative (z1) and the diaralkylated derivative (z2).

More preferred phenolic compounds are phenolic compounds having one alkyl or alkoxy group of 1 to 4 carbon atoms on an aromatic nucleus derived from phenol, which provide a higher heat resistance after curing.

Specifically, the monoaralkylated derivative (z1) is a compound represented by structural formula (4):

[Chem. 4]

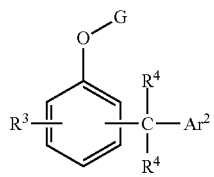

(4)

(where $R^3$ is an alkyl or alkoxy group of 1 to 4 carbon atoms; $R^4$ is each independently a hydrogen atom or an alkyl or alkoxy group of 1 to 4 carbon atoms; $Ar^2$ is each independently phenyl, naphthyl, or a structural unit derived therefrom and having at least one halogen atom or alkyl or alkoxy group of 1 to 4 carbon atoms on an aromatic nucleus thereof; and G is glycidyl). The diaralkylated derivative (z2) is a compound represented by structural formula (5):

[Chem. 5]

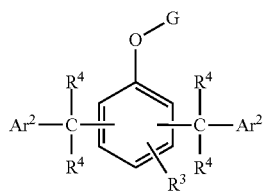

(5)

(where $R^3$ is an alkyl or alkoxy group of 1 to 4 carbon atoms; $R^4$ is each independently a hydrogen atom or an alkyl or alkoxy group of 1 to 4 carbon atoms; $Ar^e$ is each independently phenyl, naphthyl, or a structural unit derived therefrom and having at least one halogen atom or alkyl or alkoxy group of 1 to 4 carbon atoms on an aromatic nucleus thereof; and G is glycidyl).

Preferred phenolic compounds having one alkyl or alkoxy group of 1 to 4 carbon atoms on an aromatic nucleus derived from phenol include phenolic compounds having one alkyl or alkoxy group of 1 to 4 carbon atoms in an ortho or para position to the phenolic hydroxyl group, which have high reactivity and thus readily form the monoaralkylated derivative (z1) and the diaralkylated derivative (z2). Particularly preferred are o-cresol and p-cresol, which provide a higher the heat resistance after curing.

As described above, the epoxy resin according to the present invention is an epoxy resin prepared by converting into a polyglycidyl ether a phenolic resin prepared by reacting a polycondensate of the phenolic compound (b) and formaldehyde with an aralkylating agent and is a mixture of various resin components. In addition to the monoaralkylated derivative (z1) and the diaralkylated derivative (z2), the epoxy resin according to the present invention preferably contains a polyglycidyl ether of a phenolic resin in which the aromatic nuclei of the polycondensate of the phenolic compound (b) and formaldehyde are fully or partially aralkylated. One specific example is a polyfunctional compound (W) having a structure represented by structural formula (6):

[Chem. 6]

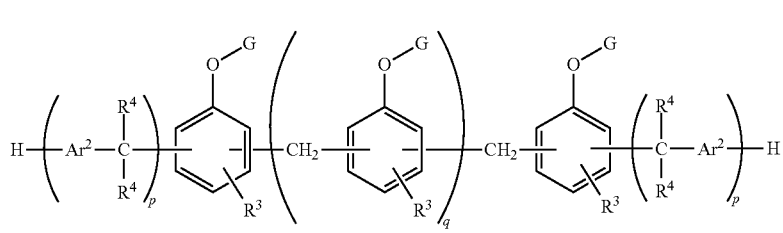

(6)

(where $R^3$ is an alkyl or alkoxy group of 1 to 4 carbon atoms; $R^4$ is each independently a hydrogen atom or an alkyl or alkoxy group of 1 to 4 carbon atoms; $Ar^e$ is each independently phenylene, naphthylene, or a structural unit derived therefrom and having at least one halogen atom or alkyl or alkoxy group of 1 to 4 carbon atoms on an aromatic nucleus thereof; G is glycidyl; p is each independently 1 or 2; and q is an integer of 0 to 20).

The polycondensation reaction of the phenolic compound (b) with formaldehyde and the reaction of the resulting polycondensate with an aralkylating agent occur mainly in the ortho and para positions to the phenolic hydroxyl group. Thus, if the phenolic compound (b) has one alkyl or alkoxy group of 1 to 4 carbon atoms in an ortho or para position to the phenolic hydroxyl group, a compound in which the two aromatic nuclei at the ends of the molecular chain of the polycondensate of the phenolic compound (b) and formaldehyde are aralkylated, i.e., the polyfunctional compound (W) represented by structural formula (6), is produced in high yield.

The polyfunctional compound (W), having a structure in which the two aromatic nuclei at the ends of the molecular chain are aralkylated, exhibits a limited increase in viscosity due to aralkylation and thus gives an epoxy resin that has high flowability and exhibits high heat resistance and flame retardancy after curing. Such compounds of controlled structure also have high molecular orientation and high reactivity and thus reduce the thermal elastic modulus and dielectric constant after curing.

As described above, phenolic compounds having one alkyl or alkoxy group of 1 to 4 carbon atoms in an ortho or para position to the phenolic hydroxyl group are preferred as the phenolic compound (b) used in the present invention because they have high reactivity and thus readily form the monoaralkylated derivative (z1) and the diaralkylated derivative (z2). Phenolic compounds having one alkyl or alkoxy group of 1 to 4 carbon atoms in an ortho or para position to the phenolic hydroxyl group are also preferred because they readily form the polyfunctional compound (W) represented by structural formula (6). Particularly preferred are o-cresol and p-cresol, which form an epoxy resin having a higher heat resistance and flame retardancy after curing.

A preferred polyfunctional compound (W) is a diglycidyl ether of a dimer of the phenolic compound (b) in which the two aromatic rings are aralkylated, e.g., a difunctional derivative (w1) represented by structural formula (6) where n is 0. The difunctional derivative (w1) is effective in improving the heat resistance and flame retardancy after curing because of its good balance of the aromatic ring concentration and the functional group concentration of the molecular structure and is also effective in reducing the thermal elastic modulus and the dielectric constant. The difunctional derivative (w1), which is a compound of relatively low molecular weight, can improve the heat resistance after curing without increasing the viscosity of the resin. The difunctional derivative (w1) is preferably present in the epoxy resin according to the present invention in an amount of 5% to 30% in terms of area percentage as determined by GPC. This results in high heat resistance and flame retardancy and low thermal elastic modulus and dielectric constant after curing.

The contents of the monoaralkylated derivative (z1), the diaralkylated derivative (z2), and the difunctional derivative (w1) in the epoxy resin according to the present invention are expressed in terms of the percentages of their respective peak areas to the total peak area of the epoxy resin according to the present invention as calculated from GPC measurements taken under the following conditions: GPC Measurement Conditions Measurement system: "HLC-8220 GPC" from Tosoh Corporation Columns: "HXL-L" guard column from Tosoh Corporation
+"TSK-GEL G2000HXL" from Tosoh Corporation
+"TSK-GEL G2000HXL" from Tosoh Corporation
+"TSK-GEL G3000HXL" from Tosoh Corporation
+"TSK-GEL G4000HXL" from Tosoh Corporation Detector: differential refractive index (RI) detector Data processing: "GPC-8020 Model II ver. 4.10" from Tosoh Corporation Measurement conditions:
Column temperature: 40° C.
Developing solvent: tetrahydrofuran
Flow rate: 1.0 mL/min
Standards: the following monodisperse polystyrene standards of known molecular weights were used in accordance with the measurement manual for "GPC-8020 Model II ver. 4.10".

Polystyrene Standards Used
"A-500" from Tosoh Corporation
"A-1000" from Tosoh Corporation
"A-2500" from Tosoh Corporation
"A-5000" from Tosoh Corporation
"F-1" from Tosoh Corporation
"F-2" from Tosoh Corporation
"F-4" from Tosoh Corporation
"F-10" from Tosoh Corporation
"F-20" from Tosoh Corporation
"F-40" from Tosoh Corporation
"F-80" from Tosoh Corporation
"F-128" from Tosoh Corporation Sample: 1.0% by mass (on a resin solids basis) microfiltered solution in tetrahydrofuran (50 μL).

The epoxy resin according to the present invention described above can be manufactured, for example, by the following method. Specifically, the epoxy resin according to the present invention can be manufactured by reacting the phenolic compound (b) with formaldehyde in the presence of a polymerization catalyst to form a polycondensate (step 1), reacting the resulting polycondensate with an aralkylating agent in an organic solvent in the presence of an acid catalyst to form a phenolic resin (step 2), and reacting the phenolic resin with an epihalohydrin in the presence of a basic catalyst (step 3).

Step 1 will be described first. The formaldehyde used for the reaction with the phenolic compound (b) in this step may be in the form of an aqueous solution, i.e., formalin, or may be in the form of a solid, i.e., paraformaldehyde. The formaldehyde is typically reacted with the phenolic compound (b) in an amount of 0.01 to 0.9 mol per mole of the phenolic compound (b). Preferably, the formaldehyde is reacted with the phenolic compound (b) in an amount of 0.01 to 0.8 mol, more preferably 0.01 to 0.7 mol, per mole of the phenolic compound (b), which facilitates the formation of a dimer of the phenolic compound (b).

Examples of polymerization catalysts for use in the reaction in step 1 include, but not limited to, acid catalysts, including inorganic acids such as hydrochloric acid, sulfuric acid, and phosphoric acid; organic acids such as methanesulfonic acid, p-toluenesulfonic acid, and oxalic acid; and Lewis acids such as boron trifluoride, anhydrous aluminum chloride, and zinc chloride. The polymerization catalyst is preferably used in an amount of 0.1% to 5% by mass of the total mass of the reactants.

Step 1 is typically performed at 100° C. to 200° C. for 1 to 20 hours. Step 1 may be performed in an organic solvent if necessary. The organic solvent used herein may be any organic solvent that can be used under the above temperature conditions. Specific examples of such organic solvents include methyl cellosolve, ethyl cellosolve, toluene, xylene, and methyl isobutyl ketone. These organic solvents, when used, are preferably present in an amount of 10% to 500% by mass of the total mass of the reactants.

To reduce coloration of the resulting polycondensate, various antioxidants and reductants may be used in step 1. Examples of antioxidants include hindered phenols such as 2,6-dialkylphenols, divalent sulfur compounds, and phosphites containing trivalent phosphorus atoms. Examples of reductants include hypophosphorous acid, phosphorous acid, thiosulfuric acid, sulfurous acid, hydrosulfite, salts thereof, and zinc.

After the reaction in step 1 is complete, the reaction mixture is neutralized or washed with water to a pH of 3 to 7, preferably 4 to 7. The reaction mixture may be neutralized or washed with water as usual. Specifically, if an acid catalyst is used as the polymerization catalyst, a basic substance such as sodium hydroxide, potassium hydroxide, sodium carbonate, ammonia, triethylenetetramine, or aniline may be used as a neutralizer. Buffers such as phosphoric acid may be added before neutralization. The mixture may be basified before being adjusted to a pH of 3 to 7, for example, with oxalic acid.

After neutralization or washing with water, the reaction mixture is distilled by heating under reduced pressure to remove impurities such as unreacted reactants, organic solvent, and by-products. The reaction product can thus be concentrated to obtain the target polycondensate.

The polycondensate obtained in step 1 preferably has a softening point of 80° C. or lower as measured in accordance with JIS K7234. This facilitates the adjustment of the contents of the monoaralkylated derivative (z1), the diaralkylated derivative (z2), and the difunctional derivative (w1) in the epoxy resin finally obtained to their respective preferred ranges described above.

In the next step, i.e., step 2, the resulting polycondensate is reacted with an aralkylating agent. Examples of aralkylating agents for use in this step include phenylmethanols, phenylmethyl halides, naphthylmethanols, naphthylmethyl halides, and styrenes. Specific examples include benzyl chloride, benzyl bromide, benzyl iodide, o-methylbenzyl chloride, m-methylbenzyl chloride, p-methylbenzyl chloride, p-ethylbenzyl chloride, p-isopropylbenzyl chloride, p-tert-butylbenzyl chloride, p-phenylbenzyl chloride, 5-chloromethylacenaphthylene, 2-naphthylmethyl chloride, 1-chloromethyl-2-naphthalene, and nucleus-substituted isomers thereof; α-methylbenzyl chloride, α,α-dimethylbenzyl chloride, benzyl methyl ether, o-methylbenzyl methyl ether, m-methylbenzyl methyl ether, p-methylbenzyl methyl ether, p-ethylbenzyl methyl ether, and nucleus-substituted isomers thereof; benzyl ethyl ether, benzyl propyl ether, benzyl isobutyl ether, benzyl n-butyl ether, p-methylbenzyl methyl ether, and nucleus-substituted isomers thereof; benzyl alcohol, o-methylbenzyl alcohol, m-methylbenzyl alcohol, p-methylbenzyl alcohol, p-ethylbenzyl alcohol, p-isopropylbenzyl alcohol, p-tert-butylbenzyl alcohol, p-phenylbenzyl alcohol, α-naphthylmethanol, and nucleus-substituted isomers thereof; and α-methylbenzyl alcohol, α,α-dimethylbenzyl alcohol, styrene, o-methylstyrene, m-methylstyrene, p-methylstyrene, α-methylstyrene, and β-methylstyrene. These aralkylating agents may be used alone or in combination.

Preferred aralkylating agents include benzyl alcohols and naphthylmethanols such as benzyl alcohol, o-methylbenzyl alcohol, m-methylbenzyl alcohol, p-methylbenzyl alcohol, p-ethylbenzyl alcohol, p-isopropylbenzyl alcohol, p-tert-butylbenzyl alcohol, p-phenylbenzyl alcohol, and α-naphthylmethanol, which have high reactivity and thus readily form the monoaralkylated derivative (z1) and the diaralkylated derivative (z2). Particularly preferred are benzyl alcohols.

In step 2, the aralkylating agent is preferably reacted with the polycondensate obtained in step 1 in an amount of 0.55 to 0.80 mol per mole of the phenolic compound (b) used in step 1, depending on, for example, the amount of unreacted phenolic compound (b) in the polycondensate and the average number of nuclei in the polycondensate. If the phenolic compounds serving as the precursors of the monoaralkylated derivative (z1), the diaralkylated derivative (z2), and the difunctional derivative (w1) are present in amounts within their respective preferred ranges, the resulting epoxy resin has high flowability and exhibits low thermal elastic modulus and high heat resistance and flame retardancy after curing.

Examples of acid catalysts for use in step 2 include inorganic acids such as hydrochloric acid, sulfuric acid, and phosphoric acid; organic acids such as methanesulfonic acid, p-toluenesulfonic acid, and oxalic acid; and Lewis acids such as boron trifluoride, anhydrous aluminum chloride, and zinc chloride. Particularly preferred are organic acids, which have high catalytic activity and thus promote the formation of the monoaralkylated derivative (z1) and the diaralkylated derivative (z2). The polymerization catalyst is preferably used in an amount of 0.1% to 5% by mass of the total mass of the reactants.

To promote the formation of the monoaralkylated derivative (z1) and the diaralkylated derivative (z2), the reaction in step 2 is preferably performed at elevated temperatures, i.e., 100° C. to 200° C., more preferably 130° C. or higher. Although the time for the reaction in step 2 varies depending on the scale of manufacture, the monoaralkylated derivative (z1) and the diaralkylated derivative (z2) form in larger amounts as the reaction mixture is maintained at 100° C. or higher, preferably 130° C. or higher, for a longer period of time. Specifically, the reaction mixture is preferably maintained at 100° C. or higher, preferably 130° C. or higher, for 4 hours or more.

The reaction in step 2 may be performed in an organic solvent to promote the formation of the monoaralkylated derivative (z1) and the diaralkylated derivative (z2). The organic solvent used herein may be any organic solvent that can be used under the above temperature conditions. Specific examples of such organic solvents include methyl cellosolve, ethyl cellosolve, toluene, xylene, and methyl isobutyl ketone. These organic solvents are preferably used in an amount of 10% to 500% by mass of the total mass of the reactants, which effectively promotes the reaction.

After step 2 is complete, the reaction solution may be directly used in step 3. Alternatively, the reaction product may be neutralized or washed with water before use in step 3. The reaction product may be neutralized or washed with water in the same manner as in step 1.

The phenolic compounds serving as the precursors of the monoaralkylated derivative (z1) and the diaralkylated derivative (z2) are preferably present in the phenolic resin obtained in step 2 in amounts of 0.5% to 15% and 3% to 20%, respectively, in terms of area percentage as determined by GPC. This facilitates the adjustment of the contents of the monoaralkylated derivative (z1) and the diaralkylated derivative (z2) in the resulting epoxy resin to their respective preferred ranges described above.

The phenolic compounds serving as the precursors of the monoaralkylated derivative (z1), the diaralkylated derivative (z2), and the difunctional derivative (w1) are preferably present in amounts of 0.5% to 15%, 3% to 20%, and 5% to 30%, respectively, in terms of area percentage as determined by GPC. This facilitates the adjustment of the contents of the monoaralkylated derivative (z1), the diaralkylated derivative (z2), and the difunctional derivative (w1) in the resulting epoxy resin to their respective preferred ranges described above.

The phenolic resin obtained in step 2 preferably has a hydroxyl equivalent weight of 150 to 250 g/eq. This facilitates the adjustment of the epoxy equivalent weight of the resulting epoxy resin to the step range described later.

In step 3, the reaction product obtained in step 2 is reacted with an epihalohydrin to obtain the target epoxy resin.

In step 3, the epihalohydrin may be added in an amount of 2 to 10 times (on a molar basis) the number of moles of phenolic hydroxyl groups present in the phenolic resin obtained in step 2. The epihalohydrin may be reacted at 20° C. to 120° C. for 0.5 to 10 hours while a basic catalyst is added either all at once or gradually in an amount of 0.9 to 2.0 times (on a molar basis) the number of moles of phenolic hydroxyl groups. The basic catalyst may be in the form of a solid or an aqueous solution. If an aqueous solution is used, it may be continuously added while water and the epihalohydrin are continuously distilled off from the reaction mixture under reduced or normal pressure. The water may be separated and removed, whereas the epihalohydrin may be continuously returned to the reaction mixture.

For industrial production, the epihalohydrin used for the first batch in the production of an epoxy compound is all fresh, whereas the epihalohydrin used for the subsequent batches is preferably a combination of epihalohydrin recovered from the crude reaction mixture and fresh epihalohydrin in an amount equivalent to the consumption during the reaction. Examples of epihalohydrins for use herein include, but not limited to, epichlorohydrin, epibromohydrin, and β-methylepichlorohydrin. In particular, epichlorohydrin is preferred because of its industrial availability.

As in step 1, examples of basic catalysts for use in step 3 include alkaline earth metal hydroxides, alkali metal carbonates, and alkali metal hydroxides. Preferred basic catalysts include alkali metal hydroxides such as sodium hydroxide and potassium hydroxide, which have high catalytic activity for epoxidation reaction. These basic catalysts may be used in the form of an aqueous solution with a concentration of about 10% to 55% by mass or may be used in the form of a solid.

Step 3 may be performed in an organic solvent to increase the reaction rate. Examples of organic solvents for use herein include, but not limited to, ketone solvents such as acetone, methyl ethyl ketone, methyl isobutyl ketone, and cyclohexanone; aromatic hydrocarbon solvents such as toluene and xylene; alcohol solvents such as methanol, ethanol, 1-propyl alcohol, isopropyl alcohol, 1-butanol, sec-butanol, and tert-butanol; cellosolve solvents such as methyl cellosolve and ethyl cellosolve; ether solvents such as tetrahydrofuran, 1,4-dioxane, 1,3-dioxane, and diethoxyethane; and aprotic polar solvents such as acetonitrile, dimethyl sulfoxide, and dimethyl formamide. These organic solvents may be used alone or may be used in combination for polarity control.

After step 3 is complete, the reaction product is washed with water and is then distilled by heating under reduced pressure to remove unreacted epihalohydrin and the organic solvent used in combination. To obtain an epoxy compound containing less hydrolyzable halogen, the washing step may be preceded by distillation to remove unreacted epihalohydrin and the organic solvent used in combination. The resulting crude product may be redissolved in an organic solvent such as toluene, methyl isobutyl ketone, or methyl ethyl ketone and may be further reacted by adding an aqueous solution of an alkali metal hydroxide such as sodium hydroxide or potassium hydroxide. During the reaction, phase transfer catalysts such as quaternary ammonium salts and crown ethers may be present to increase the reaction rate. The phase transfer catalyst, when used, is preferably present in an amount of 0.1 to 3.0 parts by mass based on 100 parts by mass of the crude epoxy product used. After the reaction is complete, salts may be removed by processes such as filtration and washing with water, and the solvent, such as toluene or methyl isobutyl ketone, may be distilled off by heating under reduced pressure to obtain the target epoxy resin.

The thus-obtained epoxy resin preferably has an epoxy equivalent weight of 200 to 300 g/eq, which results in high curability and also results in high heat resistance and flame retardancy and low thermal elastic modulus after curing.

The epoxy resin according to the present invention is characterized in that it has high flowability and exhibits low thermal elastic modulus and high heat resistance and flame retardancy after curing. Specifically, the epoxy resin according to the present invention preferably has a softening point of 40° C. to 80° C. and a melt viscosity at 150° C. of 0.01 to 10 dPa·s. Such epoxy resins have high flowability and are suitable for applications such as semiconductor sealants.

The present invention provides two types of curable resin compositions: a curable resin composition containing the phenolic-hydroxyl containing resin and a curing agent (hereinafter referred to as "curable resin composition (1)") and a curable resin composition containing the epoxy resin and a curing agent (hereinafter referred to as "curable resin composition (2)").

Examples of curing agents for the phenolic-hydroxyl containing resin in the curable resin composition (1) include epoxy resins.

Specific examples of epoxy resins for use herein include naphthalene-backbone containing epoxy resins such as 1,6-diglycidyloxynaphthalene, 2,7-diglycidyloxynaphthalene, α-naphthol novolac epoxy resins, β-naphthol novolac epoxy resins, α-naphthol/β-naphthol co-condensed novolac polyglycidyl ethers, naphthol aralkyl epoxy resins, and 1,1-bis(2,7-diglycidyloxy-1-naphthyl)alkanes; bisphenol epoxy resins such as bisphenol A epoxy resins and bisphenol F epoxy resins; biphenyl epoxy resins such as biphenyl epoxy resins and tetramethylbiphenyl epoxy resins; novolac epoxy resins such as phenol novolac epoxy resins, cresol novolac epoxy resins, bisphenol A novolac epoxy resins, bisphenol F novolac epoxy resins, epoxides of condensates of phenolic compounds and phenolic-hydroxyl containing aromatic aldehydes, and biphenyl novolac epoxy resins; triphenylmethane epoxy resins; tetraphenylethane epoxy resins; dicyclopentadiene-phenol adduct epoxy resins; phenol aralkyl epoxy resins; phosphorus-containing epoxy resins; and modified epoxy resins according to the present invention.

If an epoxy resin is used as the curing agent, the phenolic-hydroxyl containing resin and the epoxy resin are preferably blended such that the equivalent ratio of phenolic hydroxyl groups in the phenolic-hydroxyl containing resin to epoxy groups in the epoxy resin (phenolic hydroxyl/epoxy) is 1/0.5 to 1/1.5. This results in high reactivity and heat resistance after curing.

If an epoxy resin is used as the curing agent, it may be used for the phenolic-hydroxyl containing resin according to the present invention in combination with other curing agents for epoxy resins. Examples of other curing agents for epoxy resins include various known curing agents such as amines, amides, acid anhydrides, and phenolic compounds. Examples of amines include diaminodiphenylmethane, diethylenetriamine, triethylenetetramine, diaminodiphenylsulfone, isophoronediamine, imidazole, BF$_3$-amine complexes, and guanidines. Examples of amides include dicyandiamide and polyamide resins synthesized from linolenic acid dimer and ethylenediamine. Examples of acid anhydrides include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride. Examples of phenolic compounds include polyphenolic compounds such as phenol novolac resins, cresol novolac resins, aromatic hydrocarbon-formaldehyde resin-modified phenolic resins, dicyclopentadiene-phenol adduct resins, phenol aralkyl resins (Xylok resins), naphthol aralkyl resins, triphenylolmethane resins, tetraphenylolethane resins, naphthol novolac resins, naphthol-phenol co-condensed novolac resins, naphthol-cresol co-condensed novolac resins, biphenyl-modified phenolic resins (polyphenolic compounds containing bismethylene-bridged phenolic nuclei), biphenyl-modified naphthol resins (polynaphthol compounds containing bismethylene-bridged phenolic nuclei), aminotriazine-modified phenolic resins (polyphenolic compounds containing phenolic nuclei bridged by compounds such as melamine and benzoguanamine), and alkoxy-containing-aromatic-ring-modified novolac resins (polyphenolic compounds containing phenolic nuclei and alkoxy-containing aromatic rings bridged by formaldehyde).

If other curing agents for epoxy resins are used, they may be blended with the phenolic-hydroxyl containing resin according to the present invention in any proportion unless they interfere with the advantages of the present invention, i.e., high flowability and high heat resistance and flame retardancy after curing. For example, the phenolic-hydroxyl containing resin according to the present invention is preferably present in an amount of 5 to 95 parts by mass per 100 parts by mass of the total mass of both resins.

If other curing agents for epoxy resins are used, they are preferably blended with the epoxy resin such that the equivalent ratio of all active hydrogen atoms present in the phenolic-hydroxyl containing resin according to the present invention and other curing agents for epoxy resins to epoxy groups present in the epoxy resin (active hydrogen/epoxy) is 1/0.5 to 1/1.5. This results in high reactivity and high heat resistance after curing.

Examples of curing agents for the epoxy resin in the curable resin composition (2) include various known curing agents such as amines, amides, acid anhydrides, and phenolic compounds. Examples of amines include diaminodiphenylmethane, diethylenetriamine, triethylenetetramine, diaminodiphenylsulfone, isophoronediamine, imidazole, $BF_3$-amine complexes, and guanidines. Examples of amides include dicyandiamide and polyamide resins synthesized from linolenic acid dimer and ethylenediamine. Examples of acid anhydrides include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride. Examples of phenolic compounds include polyphenolic compounds such as phenol novolac resins, cresol novolac resins, aromatic hydrocarbon-formaldehyde resin-modified phenolic resins, dicyclopentadiene-phenol adduct resins, phenol aralkyl resins (Xylok resins), naphthol aralkyl resins, trimethylolmethane resins, triphenylolmethane resins, tetraphenylolethane resins, naphthol novolac resins, naphthol-phenol co-condensed novolac resins, naphthol-cresol co-condensed novolac resins, biphenyl-modified phenolic resins (polyphenolic compounds containing bismethylene-bridged phenolic nuclei), biphenyl-modified naphthol resins (polynaphthol compounds containing bismethylene-bridged phenolic nuclei), aminotriazine-modified phenolic resins (polyphenolic compounds containing phenolic nuclei bridged by compounds such as melamine and benzoguanamine), and alkoxy-containing-aromatic-ring-modified novolac resins (polyphenolic compounds containing phenolic nuclei and alkoxy-containing aromatic rings bridged by formaldehyde).

The epoxy resin and the curing agent are preferably blended such that the equivalent ratio of epoxy groups in the epoxy resin to active hydrogen atoms in the curing agent (epoxy/active hydrogen) is 1/0.5 to 1/1.5. This gives a resin composition that has high curability and exhibits high heat resistance and flame retardancy and low thermal elastic modulus after curing.

In addition to the epoxy resin according to the present invention and the curing agent, the curable resin composition (2) may contain epoxy resins other than the epoxy resin according to the present invention.

Specific examples of epoxy resins for use herein include naphthalene-backbone containing epoxy resins such as 2,7-diglycidyloxynaphthalene, α-naphthol novolac epoxy resins, β-naphthol novolac epoxy resins, α-naphthol/β-naphthol co-condensed novolac polyglycidyl ethers, naphthol aralkyl epoxy resins, and 1,1-bis(2,7-diglycidyloxy-1-naphthyl)alkanes; bisphenol epoxy resins such as bisphenol A epoxy resins and bisphenol F epoxy resins; biphenyl epoxy resins such as biphenyl epoxy resins and tetramethylbiphenyl epoxy resins; novolac epoxy resins such as phenol novolac epoxy resins, cresol novolac epoxy resins, bisphenol A novolac epoxy resins, epoxides of condensates of phenolic compounds and phenolic-hydroxyl containing aromatic aldehydes, and biphenyl novolac epoxy resins; triphenylmethane epoxy resins; tetraphenylethane epoxy resins; dicyclopentadiene-phenol adduct epoxy resins; phenol aralkyl epoxy resins; and phosphorus-containing epoxy resins.

Examples of phosphorus-containing epoxy resins include epoxides of 9,10-dihydro-9-oxa-10-phosphaphenanthrene 10-oxide (hereinafter abbreviated to "HCA"), epoxides of phenolic resins prepared by the reaction of HCA with quinones, phenol novolac epoxy resins modified with HCA, cresol novolac epoxy resins modified with HCA, and bisphenol A epoxy resins modified with phenolic resins prepared by the reaction of HCA with quinones.

If these other epoxy resins are used, the epoxy resin according to the present invention is preferably present in an amount of 50% by mass or more of the total amount of epoxy resin. This sufficiently provides the advantageous effects of the present invention, i.e., high flowability and low thermal elastic modulus and high heat resistance and flame retardancy after curing.

If these other epoxy resins are used, they are preferably blended in the curable resin composition (2) such that the equivalent ratio of epoxy groups in all epoxy resins to active hydrogen atoms in the curing agent (epoxy/active hydrogen) is 1/0.5 to 1/1.5. This gives a resin composition that has high curability and exhibits high heat resistance and flame retardancy and low thermal elastic modulus after curing.

The curable resin compositions according to the present invention may optionally contain curing accelerators. Various curing accelerators can be used, including phosphorus-containing compounds, tertiary amines, imidazoles, organic acid metal salts, Lewis acids, and amine complex salts. In particular, 2-ethyl-4-methylimidazole among imidazoles, triphenylphosphine among phosphorus-containing compounds, and 1,8-diazabicyclo-[5.4.0]-undecene (DBU) among tertiary amines are preferred for use in semiconductor sealants because of their properties such as high curability, high heat resistance, good electrical characteristics, and high moisture proofness.

Examples of halogen-free flame retardants include phosphorus-containing flame retardants, nitrogen-containing flame retardants, silicone flame retardants, inorganic flame retardants, and organic metal salt flame retardants. These flame retardants may be used alone or in combination.

Examples of phosphorus-containing flame retardants include both inorganic compounds and organic compounds. Examples of inorganic compounds include red phosphorus; ammonium phosphates such as monoammonium phosphate, diammonium phosphate, triammonium phosphate, and ammonium polyphosphate; and inorganic nitrogen-containing phosphorus compounds such as phosphoramides.

Red phosphorus is preferably subjected to surface treatment, for example, to prevent hydrolysis. Examples of surface treatments include (i) coating with inorganic compounds such as magnesium hydroxide, aluminum hydroxide, zinc hydroxide, titanium hydroxide, bismuth oxide, bismuth hydroxide, bismuth nitrate, and mixtures thereof; (ii) coating with mixtures of inorganic compounds such as magnesium hydroxide, aluminum hydroxide, zinc hydroxide, and titanium hydroxide with thermosetting resins such as phenolic resins; and (iii) double coating with inorganic compounds such as magnesium hydroxide, aluminum hydroxide, zinc hydroxide, and titanium hydroxide and thermosetting resins such as phenolic resins.

Examples of organophosphorus compounds include common organophosphorus compounds such as phosphates, phosphonic acid compounds, phosphinic acid compounds, phosphine oxides, phosphoranes, and organic nitrogen-containing phosphorus compounds. Other examples include cyclic organophosphorus compounds such as 9,10-dihydro-9-oxa-10-phosphaphenanthrene 10-oxide, 10-(2,5-dihydroxyphenyl)-10H-9-oxa-10-phosphaphenanthrene 10-oxide, and 10-(2,7-dihydroxynaphthyl)-10H-9-oxa-10-phosphaphenanthrene 10-oxide and those reacted with compounds such as epoxy resins and phenolic resins.

The content of the phosphorus-containing flame retardant may be selected depending on the type of phosphorus-containing flame retardant, the other components of the curable resin composition, and the desired flame retardancy. For example, if red phosphorus is used as the halogen-free flame retardant, it is preferably present in an amount of 0.1 to 2.0 parts by mass based on 100 parts by mass of the curable resin composition containing the phenolic-hydroxyl containing resin or epoxy resin, the curing agent, and all other additives such as fillers. If organophosphorus compounds are used, they are preferably present in an amount of 0.1 to 10.0 parts by mass, more preferably 0.5 to 6.0 parts by mass.

The phosphorus-containing flame retardant, when used, may be used in combination with other materials such as hydrotalcite, magnesium hydroxide, boron compounds, zirconium oxide, black dyes, calcium carbonate, zeolite, zinc molybdate, and activated carbon.

Examples of nitrogen-containing flame retardants include triazine compounds, cyanuric acid compounds, isocyanuric acid compounds, and phenothiazine, preferably triazines, cyanuric acid compounds, and isocyanuric acid compounds.

Examples of triazine compounds include melamine, acetoguanamine, benzoguanamine, melon, melam, succinoguanamine, ethylenedimelamine, melamine polyphosphate, and triguanamine. Other examples include (i) aminotriazine sulfates such as guanylmelamine sulfate, melem sulfate, and melam sulfate; (ii) co-condensates with formaldehyde of phenolic compounds such as phenol, cresol, xylenol, butylphenol, and nonylphenol and melamines such as melamine, benzoguanamine, acetoguanamine, and formoguanamine; (iii) mixtures of the co-condensates in group (ii) with phenolic resins such as phenol-formaldehyde condensates; and (iv) those in groups (ii) and (iii) modified with oils such as tung oil and isomerized linseed oil.

Examples of cyanuric acid compounds include cyanuric acid and melamine cyanurate.

The content of the nitrogen-containing flame retardant may be selected depending on the type of nitrogen-containing flame retardant, the other components of the curable resin composition, and the desired flame retardancy. For example, the nitrogen-containing flame retardant is preferably present in an amount of 0.05 to 10 parts by mass, more preferably 0.1 to 5 parts by mass, based on 100 parts by mass of the curable resin composition.

The nitrogen-containing flame retardant, when used, may be used in combination with other compounds such as metal hydroxides and molybdenum compounds.

The silicone flame retardant may be any organic compound containing a silicon atom, for example, silicone oil, silicone rubber, or silicone resin.

The content of the silicone flame retardant may be selected depending on the type of silicone flame retardant, the other components of the curable resin composition, and the desired flame retardancy. For example, the silicone flame retardant is preferably present in an amount of 0.05 to 20 parts by mass based on 100 parts by mass of the curable resin composition containing the phenolic-hydroxyl containing resin or epoxy resin, the curing agent, and all other additives such as fillers. The silicone flame retardant, when used, may be used in combination with other compounds such as molybdenum compounds and alumina.

Examples of inorganic flame retardants include metal hydroxides, metal oxides, metal carbonates, metal powders, boron compounds, and low-melting-point glasses.

Examples of metal hydroxides include aluminum hydroxide, magnesium hydroxide, dolomite, hydrotalcite, calcium hydroxide, barium hydroxide, and zirconium hydroxide.

Examples of metal oxides include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Examples of metal carbonates include zinc carbonate, magnesium carbonate, calcium carbonate, barium carbonate, basic magnesium carbonate, aluminum carbonate, iron carbonate, cobalt carbonate, and titanium carbonate.

Examples of metal powders include aluminum, iron, titanium, manganese, zinc, molybdenum, cobalt, bismuth, chromium, nickel, copper, tungsten, and tin powders.

Examples of boron compounds include zinc borate, zinc metaborate, barium metaborate, boric acid, and borax.

Examples of low-melting-point glasses include glassy compounds such as Ceepree (Bokusui Brown Co., Ltd.); $SiO_2$—$MgO$—$H_2O$, $PbO$—$B_2O_3$, $ZnO$—$P_2O_5$—$MgO$, $P_2O_5$—$B_2O_3$—$PbO$—$MgO$, P—Sn—O—F, $PbO$—$V_2O_5$—$TeO_2$, and $Al_2O_3$—$H_2O$ hydrated glasses; and lead borosilicate.

The content of the inorganic flame retardant may be selected depending on the type of inorganic flame retardant, the other components of the curable resin composition, and the desired flame retardancy. For example, the inorganic flame retardant is preferably present in an amount of 0.5 to 50 parts by mass, more preferably 5 to 30 parts by mass, based on 100 parts by mass of the curable resin composition.

Examples of organic metal salt flame retardants include ferrocene, acetylacetonate metal complexes, organometallic carbonyl compounds, organic cobalt salts, metal organosulfonates, and ionic compounds and coordination compounds of metal atoms with aromatic compounds and heterocyclic compounds.

The content of the organic metal salt flame retardant may be selected depending on the type of organic metal salt flame retardant, the other components of the curable resin composition, and the desired flame retardancy. For example, the organic metal salt flame retardant is preferably present in an amount of 0.005 to 10 parts by mass based on 100 parts by mass of the curable resin composition.

The curable resin composition according to the present invention may optionally contain various other additives such as silane coupling agents, release agents, pigments, and emulsifiers.

The curable resin composition according to the present invention may optionally contain inorganic fillers. The curable resin composition according to the present invention, which has high flowability, can contain a large amount of inorganic filler. Such curable resin compositions are particularly suitable for semiconductor sealants.

Examples of inorganic fillers include fused silica, crystalline silica, alumina, silicon nitride, and aluminum hydroxide. Particularly preferred is fused silica, which allows the curable resin composition according to the present invention to contain a larger amount of inorganic filler. Fused silica may be either in pulverized form or in spherical form. Spherical silica is generally preferred to increase the content of fused silica and to inhibit the increase in the melt viscosity of the curable resin composition. The particle size distribution of the spherical silica is preferably controlled to increase the content of spherical silica. The inorganic filler is preferably used in an amount of 0.5 to 95 parts by mass based on 100 parts by mass of the curable resin composition.

The curable resin composition according to the present invention may further contain conductive fillers such as silver and copper powders for applications such as conductive pastes.

The curable resin composition according to the present invention preferably contains organic solvents when used for the preparation of varnishes for printed circuit boards. Examples of organic solvents that can be used herein include methyl ethyl ketone, acetone, dimethyl formamide, methyl isobutyl ketone, methoxypropanol, cyclohexanone, methyl cellosolve, ethyl diglycol acetate, and propylene glycol monomethyl ether acetate. The type and proper amount of organic solvent used may be selected depending on the application. Examples of organic solvents suitable for printed circuit boards include polar solvents having boiling points of 160° C. or lower, such as methyl ethyl ketone, acetone, and dimethyl formamide. These organic solvents are preferably used such that the volatile content is 40% to 80% by mass. Examples of organic solvents suitable for build-up adhesive films include ketones such as acetone, methyl ethyl ketone, and cyclohexanone; acetates such as ethyl acetate, butyl acetate, cellosolve acetate, propylene glycol monomethyl ether acetate, and carbitol acetate; carbitols such as cellosolve and butyl carbitol; aromatic hydrocarbons such as toluene and xylene; and other solvents such as dimethyl formamide, dimethylacetamide, and N-methylpyrrolidone. These organic solvents are preferably used such that the volatile content is 30% to 60% by mass.

The curable resin composition according to the present invention can be prepared by homogeneously mixing the components described above. The curable resin composition, which contains the phenolic-hydroxyl containing resin or epoxy resin, the curing agent, and other optional additives such as curing accelerators, can be readily cured as in conventionally known methods to form a cured composition. Examples of such cured compositions include cured laminates, castings, adhesive layers, coatings, and films.

The curable resin composition according to the present invention, which exhibits high heat resistance and flame retardancy and low thermal elastic modulus and dielectric constant after curing, can be used for various electronic materials. In particular, the curable resin composition according to the present invention is suitable for semiconductor sealants because of its high flowability.

For example, a semiconductor sealant can be prepared by homogeneously mixing a formulation containing the phenolic-hydroxyl containing resin or epoxy resin according to the present invention and additives such as curing agents and fillers with a machine such as an extruder, kneader, or roller. Examples of fillers used herein include the inorganic fillers shown above. As described above, the filler is preferably used in an amount of 0.5 to 95 parts by mass based on 100 parts by mass of the curable resin composition. To improve the flame retardancy, the moisture resistance, and the solder crack resistance and reduce the linear expansion coefficient, the filler is preferably used in an amount of 70 to 95 parts by mass, more preferably 80 to 95 parts by mass.

The resulting semiconductor sealant can be used to form a semiconductor package, for example, by molding the semiconductor sealant with a machine such as a cast molding machine, transfer molding machine, or injection molding machine and then heating it at 50° C. to 200° C. for 2 to 10 hours. In this way, semiconductor packages can be manufactured.

EXAMPLES

The present invention is further illustrated by the following Examples and Comparative Examples, where parts and percentages are by mass unless otherwise specified. Samples were examined for (1) softening point, (2) melt viscosity, (3) GPC, (4) $^{13}$C-NMR, and (5) MS under the following conditions.
(1) Softening point measurement: JIS K7234
(2) Melt viscosity measurement: the melt viscosity was measured using an ICI viscometer according to ASTM D4287
(3) GPC: the measurement conditions are as follows:
  Measurement system: "HLC-8220 GPC" from Tosoh Corporation
  Columns: "HXL-L" guard column from Tosoh Corporation
  +"TSK-GEL G2000HXL" from Tosoh Corporation
  +"TSK-GEL G2000HXL" from Tosoh Corporation
  +"TSK-GEL G3000HXL" from Tosoh Corporation
  +"TSK-GEL G4000HXL" from Tosoh Corporation
  Detector: differential refractive index (RI) detector
  Data processing: "GPC-8020 Model II ver. 4.10" from Tosoh Corporation
  Measurement conditions:
  Column temperature: 40° C.
  Developing solvent: tetrahydrofuran
  Flow rate: 1.0 mL/min
  Standards: the following monodisperse polystyrene standards of known molecular weights were used in accordance with the measurement manual for "GPC-8020 Model II ver. 4.10".
  Polystyrene Standards Used:
  "A-500" from Tosoh Corporation
  "A-1000" from Tosoh Corporation
  "A-2500" from Tosoh Corporation
  "A-5000" from Tosoh Corporation
  "F-1" from Tosoh Corporation
  "F-2" from Tosoh Corporation
  "F-4" from Tosoh Corporation
  "F-10" from Tosoh Corporation
  "F-20" from Tosoh Corporation
  "F-40" from Tosoh Corporation
  "F-80" from Tosoh Corporation
  "F-128" from Tosoh Corporation
  Sample: 1.0% by mass (on a resin solids basis) microfiltered solution in tetrahydrofuran (50 µL).
(4) $^{13}$C-NMR: the measurement conditions are as follows:
  System: "AL-400" from JEOL Ltd.
  Mode of measurement: SGNNE (complete 1H decoupling with NOE suppression)
  Solvent: dimethyl sulfoxide Pulse angle: 45° C. pulse
Sample concentration: 30 wt %
Number of scans: 10,000
(5) MS: "AX505H (FD505H)" double-focusing mass spectrometer from JEOL Ltd.

Example 1

Manufacture of Phenolic-Hydroxyl Containing Resin (1)

In a flask equipped with a thermometer, a condenser, a fractionating column, a nitrogen inlet tube, and a stirrer were placed 216.3 g (2.00 mol) of o-cresol and 14.5 g (0.20 mol) of 41% by mass formalin. To the mixture was added 4.0 g of oxalic acid. The mixture was heated to and reacted at 100° C. for 3 hours. While water was being collected with the fractionating column, 76.7 g (1.05 mol) of 41% by mass formalin was added dropwise over 1 hour. After the addition was complete, the mixture was heated to 150° C. over 1 hour and was then reacted at 150° C. for another 2 hours. After the reaction was complete, 600 g of methyl isobutyl ketone was added, and the mixture was transferred to a separating funnel and was washed with water. After the mixture was washed with water until the effluent was neutral, unreacted o-cresol and methyl isobutyl ketone were removed from the organic layer by heating under reduced pressure to give 190 g of a cresol novolac intermediate (1). The resulting cresol novolac intermediate (1) had a hydroxyl equivalent weight of 117 g/eq and a softening point of 64° C. FIG. 1 shows a GPC chart of the cresol novolac intermediate (1).

Figure 2:
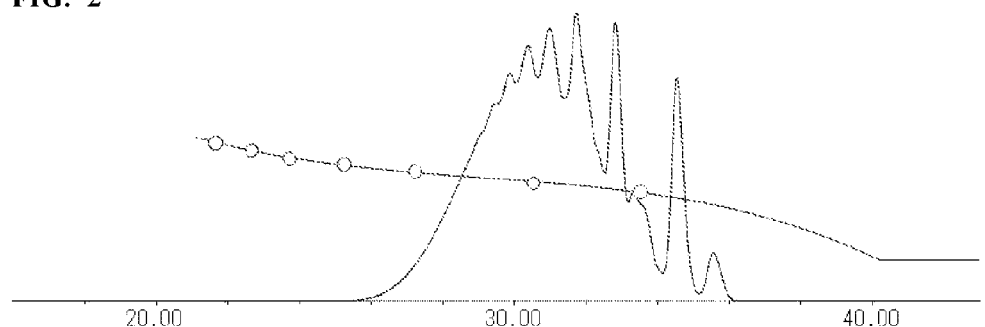
FIG. 2 is a GPC chart of a phenolic-hydroxyl containing resin (1) prepared in Example 1.
Figure 3:
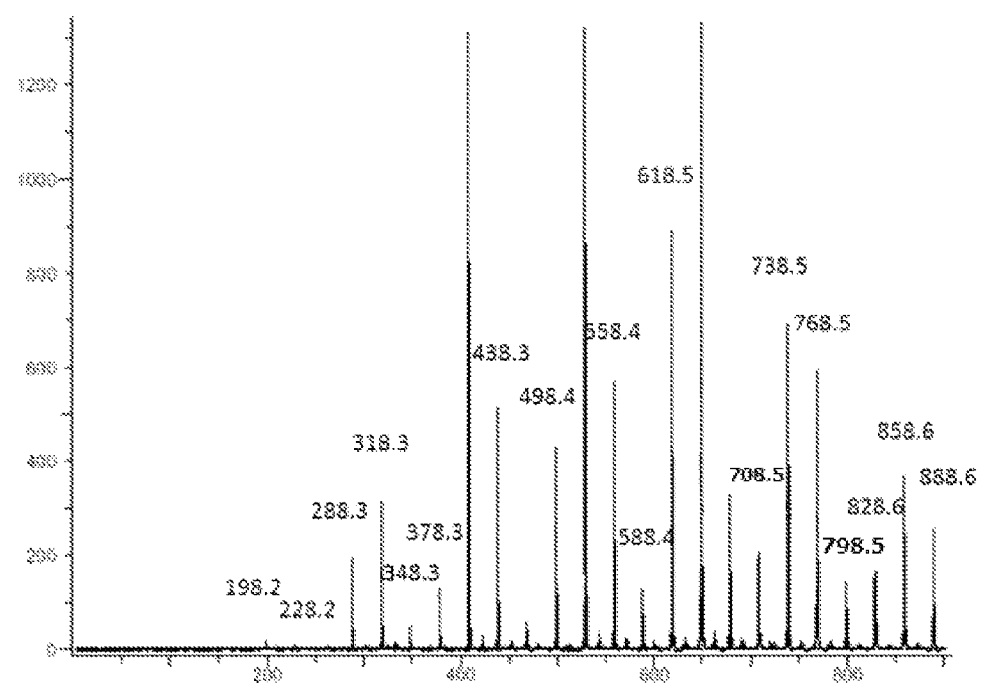
FIG. 3 is an MS spectrum of the phenolic-hydroxyl containing resin (1) prepared in Example 1.
Figure 4:
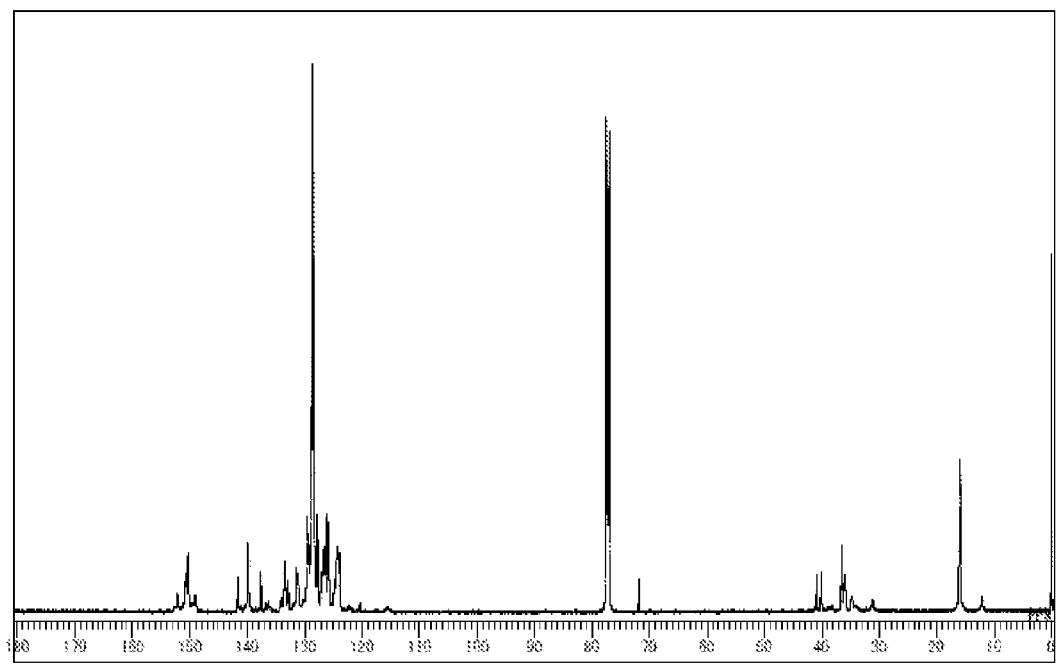
FIG. 4 is a $^{13}$C-NMR chart of the phenolic-hydroxyl containing resin (1) prepared in Example 1.

In a flask equipped with a thermometer, a dropping funnel, a condenser, a fractionating column, and a stirrer were placed 117 g (1.0 mol) of the resulting cresol novolac intermediate (1), 71 g of benzyl alcohol, 2 g of p-toluenesulfonic acid, and 117 g of xylene. The mixture was heated from room temperature to 140° C. with stirring, was reacted at 140° C. for 4 hours, and was then heated to and reacted at 150° C. for another 3 hours. After the reaction was complete, the mixture was allowed to cool to 80° C., was neutralized with 1 g of 49% sodium hydroxide, and was dried by heating under reduced pressure to give 150 parts by mass of a phenolic-hydroxyl containing resin (1). The resulting phenolic-hydroxyl containing resin (1) had a softening point (B&R) of 74° C., a melt viscosity (measured at 150° C. with an ICI viscometer) of 1.2 dPa·s, and a hydroxyl equivalent weight of 181 g/eq. FIG. 2 shows a GPC chart of the phenolic-hydroxyl containing resin (1). FIG. 3 shows an MS spectrum of the phenolic-hydroxyl containing resin (1). FIG. 4 shows a $^{13}$C-NMR chart of the phenolic-hydroxyl containing resin (1). The content of the monoaralkylated derivative (x1) in the phenolic-hydroxyl containing resin (1) was calculated to be 1.8% from the GPC chart. The content of the diaralkylated derivative (x2) in the phenolic-hydroxyl containing resin (1) was calculated to be 7.5% from the GPC chart. The content of the difunctional derivative (y1) in the phenolic-hydroxyl containing resin (1) was calculated to be 15.5% from the GPC chart.

Example 2

Manufacture of Epoxy Resin (1)

Figure 5:
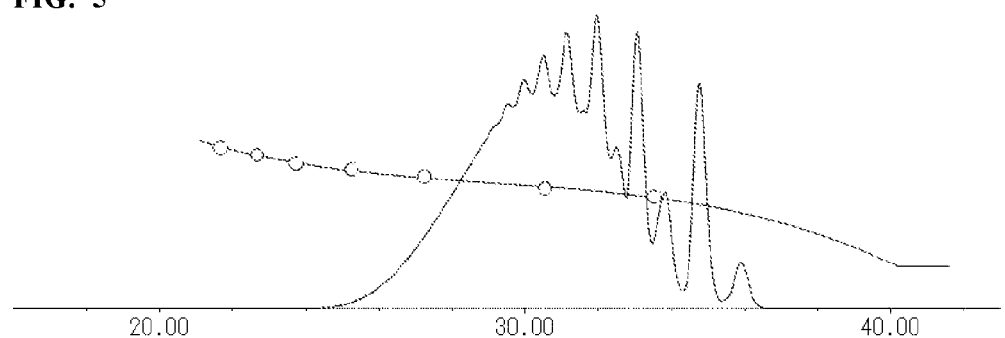
FIG. 5 is a GPC chart of an epoxy resin (A-1) prepared in Example 1.
Figure 6:
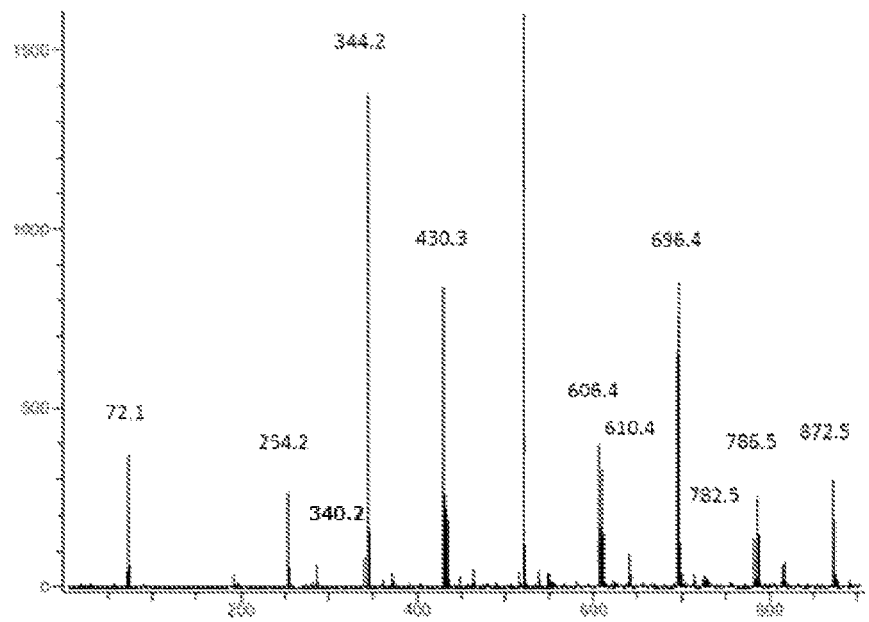
FIG. 6 is an MS spectrum of the epoxy resin (A-1) prepared in Example 1.
Figure 7:
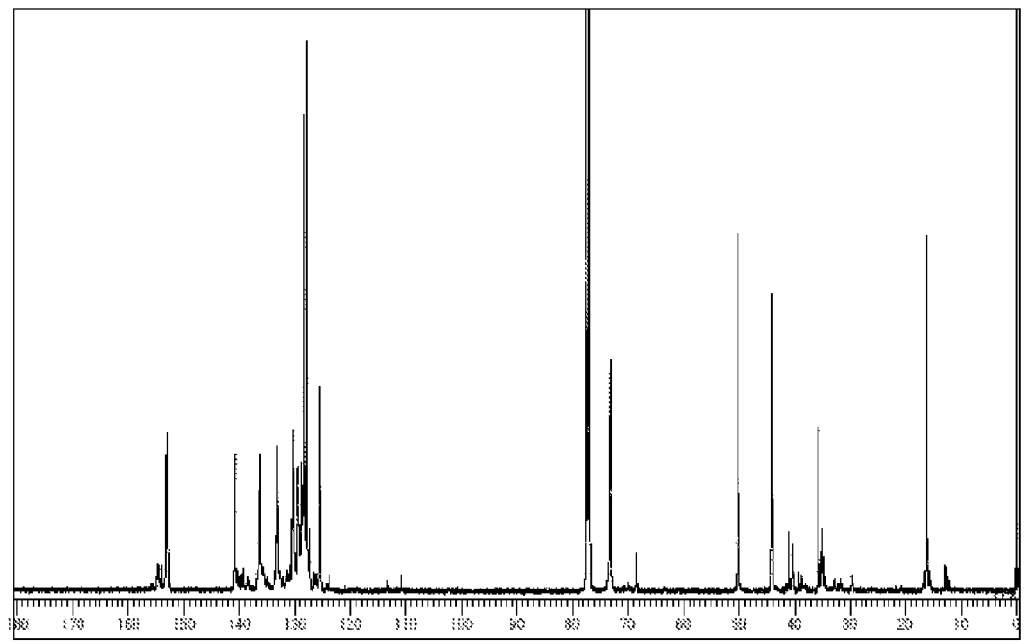
FIG. 7 is a $^{13}$C-NMR chart of the epoxy resin (A-1) prepared in Example 1.

In a flask equipped with a thermometer, a condenser, and a stirrer, 181 g (1.0 equivalent of hydroxyl groups) of the phenolic-hydroxyl containing resin (1) prepared in Example 1, 555 g (6.0 mol) of epichlorohydrin, and 167 g of n-butanol were placed under nitrogen gas purging. To the mixture, 2 g of tetraethylbenzylammonium chloride was added and dissolved with stirring. After the solution was heated to 65° C., the pressure was reduced to the level at which azeotropic distillation occurred, and 90 g (1.1 mol) of 49% aqueous sodium hydroxide solution was added dropwise over 5 hours. Stirring was then continued under the same conditions for 0.5 hour. During this process, the azeotropic distillate was separated with a Dean-Stark trap. Whereas the water layer was removed, the oil layer was returned to the reaction system to continue the reaction. Subsequently, unreacted epichlorohydrin was distilled off under reduced pressure. To the resulting crude epoxy resin were added 590 g of methyl isobutyl ketone and 177 g of n-butanol, and the resin was dissolved therein. To the solution was added 10 g of 10% aqueous sodium hydroxide solution. The mixture was reacted at 80° C. for 2 hours and was then washed with 150 g of water three times until the effluent was neutral. After the mixture was dehydrated by azeotropic distillation and was microfiltered, the solvent was distilled off under reduced pressure to give 221 g of an epoxy resin (1). The resulting epoxy resin (1) had a softening point (B&R) of 59° C., a melt viscosity (measured at 150° C. with an ICI viscometer) of 1.1 dPa·s, and an epoxy equivalent weight of 268 g/eq. FIG. 5 shows a GPC chart of the epoxy resin (1). FIG. 6 shows an MS spectrum of the epoxy resin (1). FIG. 7 shows a $^{13}$C-NMR chart of the epoxy resin (1). The content of the component corresponding to the monoaralkylated derivative (z1) in the epoxy resin (1) was calculated to be 1.6% from the GPC chart. The content of the component corresponding to the diaralkylated derivative (z2) in the epoxy resin (1) was calculated to be 7.0% from the GPC chart. The content of the component corresponding to the difunctional derivative (w1) in the epoxy resin (1) was calculated to be 13.2% from the GPC chart.

Comparative Example of Manufacture 1

Manufacture of Phenolic-Hydroxyl Containing Resin (1')

In a flask equipped with a thermometer, a dropping funnel, a condenser, a fractionating column, and a stirrer was placed 104 g (1.0 mol) of a phenol novolac resin ("M-70G", Showa Highpolymer Co., Ltd., softening point: 70° C.) The phenol novolac resin was heated to 110° C., and 86 g of benzyl chloride was added dropwise over 2 hours. During this process, the resulting hydrogen chloride gas was purged with nitrogen gas and was absorbed into an external aqueous sodium hydroxide solution. After the addition was complete, the mixture was aged for 2 hours and was then heated to 150° C. to complete the reaction. Subsequently, the flask was evacuated under reduced pressure with an aspirator. The molten resin was removed and cooled to give 130 g of a reddish brown transparent phenolic-hydroxyl containing resin (1'). The resulting phenolic-hydroxyl containing resin (1') had a softening point (B&R) of 66° C., a melt viscosity (measured at 150° C. with an ICI viscometer) of 1.3 dPa·s, and a hydroxyl equivalent weight of 168 g/eq.

Comparative Example of Manufacture 1

Manufacture of Epoxy Resin (1')

The conversion into a glycidyl ether in Example 2 was repeated except that the phenolic-hydroxyl containing resin (1) was replaced with 168 g (1 equivalent of hydroxyl groups) of the phenolic-hydroxyl containing resin (1'). The resulting epoxy resin (1') had a softening point (B&R) of 49° C., a melt viscosity (measured at 150° C. with an ICI viscometer) of 1.0 dPa·s, and an epoxy equivalent weight of 254 g/eq.

Example 3 and Comparative Example 1

Preparation of Curable Resin Compositions (1A)

The phenolic-hydroxyl containing resin (1), the phenolic-hydroxyl containing resin (1'), a cresol novolac epoxy resin ("N-655-EXP-S", DIC Corporation, epoxy equivalent weight: 200 g/eq), triphenylphosphine, serving as a curing accelerator, fused silica, serving as an inorganic filler, a silane coupling agent, carnauba wax, and carbon black were blended according to the compositions shown in Table 1 below. The mixtures were melted and kneaded at 90° C. with a two-roll mill for 5 minutes to give curable resin compositions (1A).

The specific components used for the preparation of the curable resin compositions are as follows:

Fused silica: "FB-560" from Denki Kagaku Kogyo Kabushiki Kaisha

Silane coupling agent: γ-glycidoxytriethoxysilane ("KBM-403", Shin-Etsu Chemical Co., Ltd.)

Carnauba wax: "PEARL WAX No. 1-P" from Cerarica Noda Co., Ltd.

Preparation of Test Pieces (A)

The resulting curable resin compositions (1A) were crushed and molded with a transfer molding machine at a pressure of 70 kg/cm², a ram speed of 5 cm/sec, and a temperature of 175° C. over 180 seconds to form rectangular test pieces (A) with a width of 12.7 mm, a length of 127 mm, and a thickness of 1.6 mm.

Evaluation of Flame Retardancy

Five test pieces (A) were subjected to a burning test according to UL-94.

*1: total burning time of five test pieces (seconds)
*2: maximum burning time after one application of flame (seconds)

The results of these evaluations are shown in Table 1.

TABLE 1

|  |  | Example 3 | Comparative Example 1 |
|---|---|---|---|
| Phenolic-hydroxyl containing resin | (1) | 48 |  |
|  | (1') |  | 46 |
| Epoxy resin | N-665-EXP-S | 52 | 54 |
| Triphenylphosphine |  | 1 | 1 |
| Fused silica |  | 686 | 686 |
| Coupling agent |  | 1 | 1 |
| Carnauba wax |  | 2 | 2 |
| Carbon black |  | 5 | 5 |
| Flame retardancy ΣF (sec) |  | 36 | 53 |
| Flame retardancy Fmax (sec) |  | 7 | 11 |

Example 4 and Comparative Example 2

Preparation of Curable Resin Compositions (1B)

The phenolic-hydroxyl containing resin (1), the phenolic-hydroxyl containing resin (1'), a cresol novolac epoxy resin ("N-655-EXP-S", DIC Corporation, epoxy equivalent weight: 200 g/eq), and triphenylphosphine, serving as a curing accelerator, were blended according to the compositions shown in Table 2 below. The mixtures were melted and kneaded at 120° C. for 1 hour to give curable resin compositions (1B).

Preparation of Test Pieces (B)

The resulting curable resin compositions (1B) were crushed and molded with a transfer molding machine at a pressure of 50 kg/cm², a ram speed of 5 cm/sec, and a temperature of 150° C. over 300 seconds to form rectangular test pieces (B) with a width of 12.7 mm, a length of 127 mm, and a thickness of 2.4 mm.

Evaluation of Heat Resistance

The test pieces (B) were cut into samples having a size of 5 mm×54 mm×2.4 mm. These samples were tested with a viscoelastometer ("Solids Analyzer RSA II", Rheometrics Scientific, Inc., rectangular tension mode, frequency: 1 Hz, heating rate: 3° C./min). The glass transition temperature was determined as the temperature at which the change in elastic modulus was maximized (the rate of change in tan δ was maximized). The results of these evaluations are shown in Table 2.

Evaluation of Thermal Elastic Modulus

The test pieces (B) were cut into samples having a size of 5 mm×54 mm×2.4 mm. These samples were tested with a viscoelastometer (DMA: "Solids Analyzer RSA II", Rheometrics Scientific, Inc., rectangular tension mode, frequency: 1 Hz, heating rate: 3° C./min). The storage modulus was determined from the resulting chart. The results of these evaluations are shown in Table 2.

Evaluation of Dielectric Constant

The test pieces (B) were tested for dielectric constant at 1 GHz according to JIS-C-6481 with an "HP4291B" impedance material analyzer from Agilent Technologies, Inc. after complete drying and storage in a room at 23° C. and a humidity of 50% for 24 hours. The results of these evaluations are shown in Table 2.

TABLE 2

|  |  | Example 4 | Comparative Example 2 |
|---|---|---|---|
| Phenolic-hydroxyl containing resin | (1) | 48 |  |
|  | (1') |  | 46 |
| Epoxy resin | N-665-EXP-S | 52 | 54 |
| Triphenylphosphine |  | 1 | 1 |
| Heat resistance (° C.) |  | 132 | 126 |
| Thermal elastic modulus (MPa) |  | 20 | 28 |
| Dielectric constant |  | 3.06 | 3.24 |

Examples 5 and 6 and Comparative Example 3

Preparation of Curable Resin Compositions (2A)

The epoxy resin (1), the epoxy resin (1'), a phenol novolac phenolic resin ("TD-2131", DIC Corporation, hydroxyl equivalent weight: 104 g/eq), a phenol aralkyl resin ("XLC-3L", Mitsui Chemicals, Inc., hydroxyl equivalent weight: 172 g/eq), triphenylphosphine, serving as a curing accelerator, fused silica, serving as an inorganic filler, a silane coupling agent, carnauba wax, and carbon black were blended according to the compositions shown in Table 3 below. The mixtures were melted and kneaded at 90° C. with a two-roll mill for 5 minutes to give curable resin compositions (2A).

The specific components used for the preparation of the curable resin compositions are as follows:

Fused silica: "FB-560" from Denki Kagaku Kogyo Kabushiki Kaisha

Silane coupling agent: γ-glycidoxytriethoxysilane ("KBM-403", Shin-Etsu Chemical Co., Ltd.)

Carnauba wax: "PEARL WAX No. 1-P" from Cerarica Noda Co., Ltd.

Preparation of Test Pieces (A)

The resulting curable resin compositions (2A) were crushed and molded with a transfer molding machine at a pressure of 70 kg/cm², a ram speed of 5 cm/sec, and a temperature of 175° C. over 180 seconds to form rectangular test pieces (A) with a width of 12.7 mm, a length of 127 mm, and a thickness of 1.6 mm.

Evaluation of Flame Retardancy

Five test pieces (A) were subjected to a burning test according to UL-94.

*1: total burning time of five test pieces (seconds)

*2: maximum burning time after one application of flame (seconds)

The results of these evaluations are shown in Table 3.

TABLE 3

|  |  | Example 5 | Example 6 | Comparative Example 3 |
|---|---|---|---|---|
| Epoxy resin | (1) | 72 | 61 |  |
|  | (1') |  |  | 71 |
| Phenolic resin | TD-2131 | 28 |  | 29 |
|  | XLC-3L |  | 39 |  |
| Triphenylphosphine |  | 1 | 1 | 1 |
| Fused silica |  | 686 | 686 | 686 |
| Coupling agent |  | 1 | 1 | 1 |
| Carnauba wax |  | 2 | 2 | 2 |
| Carbon black |  | 5 | 5 | 5 |
| Flame retardancy ΣF (sec) |  | 37 | 13 | 78 |
| Flame retardancy Fmax (sec) |  | 7 | 3 | 14 |

Examples 7 and 8 and Comparative Example 4

Preparation of Curable Resin Compositions (2B)

The epoxy resin (1), the epoxy resin (1'), a phenol novolac phenolic resin ("TD-2131", DIC Corporation, hydroxyl equivalent weight: 104 g/eq), a phenol aralkyl resin ("XLC-3L", Mitsui Chemicals, Inc., hydroxyl equivalent weight: 172 g/eq), and triphenylphosphine, serving as a curing accelerator, were blended according to the compositions shown in Table 4 below. The mixtures were melted and kneaded at 120° C. for 1 hour to give curable resin compositions (2B).

Preparation of Test Pieces (B)

The resulting curable resin compositions (2B) were crushed and molded with a transfer molding machine at a pressure of 50 kg/cm², a ram speed of 5 cm/sec, and a temperature of 150° C. over 300 seconds to form rectangular test pieces (A) with a width of 12.7 mm, a length of 127 mm, and a thickness of 2.4 mm.

Evaluation of Heat Resistance

The test pieces (B) were cut into samples having a size of 5 mm×54 mm×2.4 mm. These samples were tested with a viscoelastometer ("Solids Analyzer RSA II", Rheometrics Scientific, Inc., rectangular tension mode, frequency: 1 Hz, heating rate: 3° C./min). The glass transition temperature was determined as the temperature at which the change in elastic modulus was maximized (the rate of change in tan δ was maximized). The results of these evaluations are shown in Table 4.

Evaluation of Thermal Elastic Modulus

The test pieces (B) were cut into samples having a size of 5 mm×54 mm×2.4 mm. These samples were tested with a viscoelastometer (DMA: "Solids Analyzer RSA II", Rheometrics Scientific, Inc., rectangular tension mode, frequency: 1 Hz, heating rate: 3° C./min). The storage modulus was determined from the resulting chart. The results of these evaluations are shown in Table 4.

Evaluation of Dielectric Constant

The test pieces (B) were tested for dielectric constant at 1 GHz according to JIS-C-6481 with an "HP4291B" impedance material analyzer from Agilent Technologies, Inc. after complete drying and storage in a room at 23° C. and a humidity of 50% for 24 hours. The results of these evaluations are shown in Table 4.

TABLE 4

|  |  | Example 7 | Example 8 | Comparative Example 4 |
|---|---|---|---|---|
| Epoxy resin | (1) | 72 | 61 |  |
|  | (1') |  |  | 71 |
| Phenolic resin | TD-2131 | 28 |  | 29 |
|  | XLC-3L |  | 39 |  |
| Triphenylphosphine |  | 1 | 1 | 1 |
| Heat resistance (° C.) |  | 135 | 128 | 118 |
| Thermal elastic modulus (MPa) |  | 22 | 17 | 34 |
| Dielectric constant |  | 3.08 | 3.05 | 3.17 |

The invention claimed is:

1. A phenolic-hydroxyl containing resin prepared by reacting a polycondensate of a phenolic compound (a) and formaldehyde with an aralkylating agent, the phenolic-hydroxyl containing resin comprising as essential components:

a monoaralkylated derivative (x1) represented by structural formula (1):

[Chem. 1]

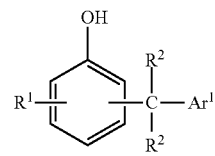

(wherein $R^1$ is an alkyl or alkoxy group of 1 to 4 carbon atoms; $R^2$ is each independently a hydrogen atom or an alkyl or alkoxy group of 1 to 4 carbon atoms; and $Ar^1$ is phenyl or a structural unit derived therefrom and having at least one halogen atom or alkyl or alkoxy group of 1 to 4 carbon atoms on an aromatic nucleus thereof); and a diaralkylated derivative (x2) represented by structural formula (2):

[Chem. 2]

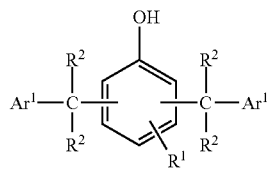

(wherein $R^1$ is an alkyl or alkoxy group of 1 to 4 carbon atoms; $R^2$ is each independently a hydrogen atom or an alkyl or alkoxy group of 1 to 4 carbon atoms; and $Ar^1$ is each independently phenyl or a structural unit derived therefrom and having at least one halogen atom or alkyl or alkoxy group of 1 to 4 carbon atoms on an aromatic nucleus thereof), the monoaralkylated derivative (x1) being present in an amount of 0.5% to 15% in terms of area percentage as determined by GPC, the diaralkylated derivative (x2) being present in an amount of 3% to 20% in terms of area percentage as determined by GPC.

2. The phenolic-hydroxyl containing resin according to claim 1, comprising, in addition to the monoaralkylated derivative (x1) and the diaralkylated derivative (x2), a polyfunctional compound (Y) represented by structural formula (3):

[Chem. 3]

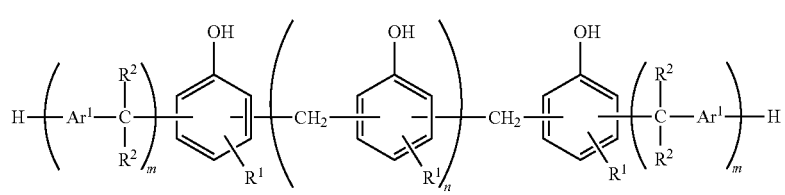

(3)

(wherein $R^1$ is an alkyl or alkoxy group of 1 to 4 carbon atoms; $R^2$ is each independently a hydrogen atom or an alkyl or alkoxy group of 1 to 4 carbon atoms; $Ar^1$ is each independently phenylene or a structural unit derived therefrom and having at least one halogen atom or alkyl or alkoxy group of 1 to 4 carbon atoms on an aromatic nucleus thereof; m is each independently 1 or 2; and n is an integer of 0 to 20).

3. The phenolic-hydroxyl containing resin according to claim 2, wherein a difunctional derivative (y1) represented by structural formula (3) wherein n is 0 is present in an amount of 5% to 30% of the total amount of phenolic-hydroxyl containing resin in terms of area percentage as determined by GPC.

4. The phenolic-hydroxyl containing resin according to claim 2, wherein the phenolic-hydroxyl containing resin has a melting point of 40° C. to 90° C. and a melt viscosity at 150° C. of 0.01 to 10.0 dPa·s.

5. The phenolic-hydroxyl containing resin according to claim 1, wherein the phenolic-hydroxyl containing resin has a melting point of 40° C. to 90° C. and a melt viscosity at 150° C. of 0.01 to 10.0 dPa·s.

6. A curable resin composition comprising the phenolic-hydroxyl containing resin according to claim 2 and a curing agent.

7. A curable resin composition comprising the phenolic-hydroxyl containing resin according to claim 1 and a curing agent.

8. A cured composition prepared by curing the curable resin composition according to claim 7.

9. A semiconductor sealant comprising the curable resin composition according to claim 7 and an inorganic filler.

10. An epoxy resin prepared by converting into a polyglycidyl ether a phenolic resin prepared by reacting a polycondensate of a phenolic compound (b) and formaldehyde with an aralkylating agent, the epoxy resin comprising as essential components:

a glycidyl ether (z1) of a monoaralkylated derivative represented by structural formula (4):

[Chem. 4]

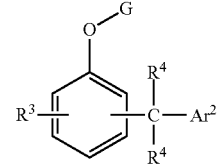

(4)

(wherein $R^3$ is an alkyl or alkoxy group of 1 to 4 carbon atoms; $R^4$ is each independently a hydrogen atom or an alkyl or alkoxy group of 1 to 4 carbon atoms; $Ar^2$ is phenyl or a structural unit derived therefrom and having at least one halogen atom or alkyl or alkoxy group of 1 to 4 carbon atoms on an aromatic nucleus thereof; and G is glycidyl), and a glycidyl ether (z2) of a diaralkylated derivative represented by structural formula (5):

[Chem. 5]

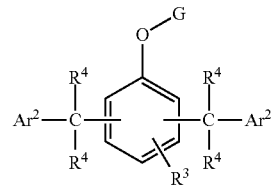

(5)

(wherein $R^3$ is an alkyl or alkoxy group of 1 to 4 carbon atoms; $R^4$ is each independently a hydrogen atom or an alkyl or alkoxy group of 1 to 4 carbon atoms; $Ar^e$ is each independently phenyl or a structural unit derived therefrom and having at least one halogen atom or alkyl or alkoxy group of 1 to 4 carbon atoms on an aromatic nucleus thereof; and G is glycidyl), the glycidyl ether (z1) of the monoaralkylated derivative being present in an amount of 0.5% to 15% in terms of area percentage as determined by GPC, the glycidyl ether (z2) of the diaralkylated derivative being present in an amount of 3% to 20% in terms of area percentage as determined by GPC.

11. The epoxy resin according to claim 10, comprising, in addition to the glycidyl ether (z1) of the monoaralkylated derivative and the glycidyl ether (z2) of the diaralkylated derivative, a polyfunctional compound (W) represented by structural formula (6):

[Chem. 6]

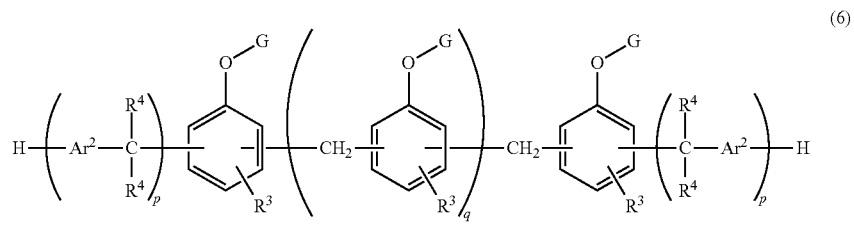

(6)

(wherein $R^3$ is an alkyl or alkoxy group of 1 to 4 carbon atoms; $R^4$ is each independently a hydrogen atom or an alkyl or alkoxy group of 1 to 4 carbon atoms; $Ar^2$ is each independently phenylene or a structural unit derived therefrom and having at least one halogen atom or alkyl or alkoxy group of 1 to 4 carbon atoms on an aromatic nucleus thereof; G is glycidyl; p is each independently 1 or 2; and q is an integer of 0 to 20).

12. The epoxy resin according to claim 11, wherein a difunctional derivative (w1) represented by structural formula (6) wherein n is 0 is present in an amount of 5% to 30% of the total amount of epoxy resin in terms of area percentage as determined by GPC.

13. The epoxy resin according to claim 11, wherein the epoxy resin has a melting point of 40° C. to 80° C. and a melt viscosity at 150° C. of 0.01 to 10.0 dPa·s.

14. The epoxy resin according to claim 10, wherein the epoxy resin has a melting point of 40° C. to 80° C. and a melt viscosity at 150° C. of 0.01 to 10.0 dPa·s.

15. A curable resin composition comprising the epoxy resin according to claim 10 and a curing agent.

16. A cured composition prepared by curing the curable resin composition according to claim 15.

17. A semiconductor sealant comprising the curable resin composition according to claim 15 and an inorganic filler.

18. A curable resin composition comprising the epoxy resin according to claim 11 and a curing agent.

* * * * *